(12) United States Patent
Kim et al.

(10) Patent No.: US 9,472,582 B2
(45) Date of Patent: Oct. 18, 2016

(54) THIN FILM TRANSISTOR ARRAY PANEL AND MANUFACTURING METHOD THEREOF

(71) Applicant: Samsung Display Co., Ltd., Yongin, Gyeonggi-Do (KR)

(72) Inventors: Seul-Ki Kim, Anyang-si (KR); Seung Jin Kim, Asan-si (KR); Jae-Hyun Park, Yongin-si (KR); Jeong Wook Heo, Asan-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/219,198

(22) Filed: Mar. 19, 2014

(65) Prior Publication Data

US 2014/0306216 A1 Oct. 16, 2014

(30) Foreign Application Priority Data

Apr. 10, 2013 (KR) .................. 10-2013-0039539

(51) Int. Cl.
- *H01L 27/12* (2006.01)
- *G02F 1/1343* (2006.01)
- *G02F 1/1362* (2006.01)

(52) U.S. Cl.
CPC ..... *H01L 27/1248* (2013.01); *G02F 1/134363* (2013.01); *G02F 1/136227* (2013.01); *H01L 27/1296* (2013.01); *G02F 2001/13625* (2013.01); *G02F 2001/136231* (2013.01)

(58) Field of Classification Search
CPC ... H01L 29/7869; H01L 21/16; H01L 21/00; H01L 29/24; H01L 21/479; B82Y 10/00; B82Y 20/00; C30B 25/02; C30B 29/403; G02F 1/136213
See application file for complete search history.

(56) References Cited

U.S. PATENT DOCUMENTS

| | | | |
|---|---|---|---|
| 7,688,414 B2 | 3/2010 | Oh et al. | |
| 8,144,296 B2 | 3/2012 | Kwon | |
| 8,154,699 B2 | 4/2012 | Yamaguchi et al. | |
| 2013/0313556 A1* | 11/2013 | Kim .................. | G02F 1/136227 257/59 |

FOREIGN PATENT DOCUMENTS

| | | |
|---|---|---|
| EP | 2573617 A1 | 3/2013 |
| JP | 2000-267128 A | 9/2000 |
| JP | 2001-154220 A | 6/2001 |
| JP | 2002-116714 A | 4/2002 |
| JP | 2009-128397 A | 6/2009 |
| KR | 1020080056811 A | 6/2008 |
| KR | 1020110071313 A | 6/2011 |
| KR | 1020120124332 A | 11/2012 |

OTHER PUBLICATIONS

Machine Translation of Bo-Yeong Jeong, KR-10-2011-0071313A.*
Machine Translation of Kwack et al., KR-10-2012-0124332A.*
Machine Translation of Nakazawa Misako, JP 2000-267128A.*
Machine Translation of Nakagawa Kazuo, JP 2001-154220A.*
Machine Translation of Nakao Hajime, JP 2009-128397A.*
The Extended European Search Report for European Patent Application No. 14163719.9 dated Aug. 22, 2014.

* cited by examiner

*Primary Examiner* — Michelle Mandala
(74) *Attorney, Agent, or Firm* — Cantor Colburn LLP

(57) ABSTRACT

A thin film transistor array panel includes an insulation substrate; a gate line and a data line on the insulation substrate; a first passivation layer on the gate line and the data line; an organic layer on the first passivation layer; a first electrode on the organic layer; a second passivation layer on the first electrode; and a second electrode on the second passivation layer. An edge of the organic layer is exposed by the first electrode.

16 Claims, 58 Drawing Sheets

FIG. 18
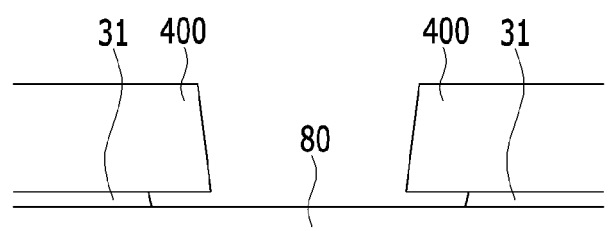
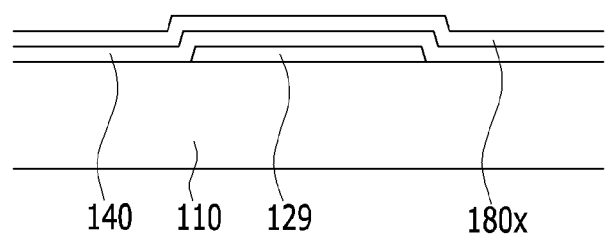

THIN FILM TRANSISTOR ARRAY PANEL AND MANUFACTURING METHOD THEREOF

This application claims priority to Korean Patent Application No. 10-2013-0039539 filed on Apr. 10, 2013, and all the benefits accruing therefrom under 35 U.S.C. §119, the entire contents of which are incorporated herein by reference.

BACKGROUND (a) Field

The invention relates to a thin film transistor array panel and a method of manufacturing the same.

(b) Description of the Related Art

A liquid crystal display, is one of the most widely used flat panel displays. The liquid crystal display is a display device which adjusts a quantity of penetrated light by applying a voltage to an electrode of a display panel and re-arranges liquid crystal molecules of a liquid crystal layer of the display panel.

The liquid crystal display may be manufactured to be relatively thin. However, the liquid crystal display has a disadvantage in that side visibility thereof is worse than front visibility, so that various types of liquid crystal arrangements and driving methods have been developed in order to overcome the disadvantage.

SUMMARY

One or more exemplary embodiment of the invention provides a liquid crystal display capable of reducing or effectively preventing an increase in manufacturing cost even when two field generating electrodes are disposed on a single substrate of one display panel, and a method of manufacturing the same.

An exemplary embodiment of the invention provides a thin film transistor array panel, including: an insulation substrate; a gate line and a data line on the insulation substrate; a first passivation layer on the gate line and the data line; an organic layer on the first passivation layer; a first electrode on the organic layer; a second passivation layer on the first electrode; and a second electrode on the second passivation layer. An edge of the organic layer is exposed by an edge of the first electrode.

The gate line may include a gate pad portion, the data line may include a data pad portion, and the thin film transistor array panel may further include a blocking member at a peripheral region of the gate pad portion and the data pad portion, and on the organic layer.

The blocking member may be in a same layer as the first electrode.

The blocking member at the peripheral region of the gate pad portion and the data pad portion may overlap an edge of the organic layer at the peripheral region of the gate pad portion and the data pad portion.

One of the first electrode and the second electrode may have a planar shape, and the other of the first electrode and the second electrode includes a branch electrode.

The thin film transistor array panel may further include a common voltage line in a same layer as the gate line or the data line. An opening may be defined in the organic layer and the first electrode and expose a portion of the common voltage line, a contact hole may be defined in the second passivation layer and expose the first electrode, and the thin film transistor array panel may further include a connecting member covering the common voltage line exposed through the opening and the first electrode exposed through the contact hole.

The connecting member may be spaced apart from the second electrode, and may be in a same layer as the second electrode.

Another exemplary embodiment of the invention provides a thin film transistor array panel, including: an insulation substrate; a gate line and a data line on the insulation substrate; a first passivation layer on the gate line and the data line; an organic layer on the first passivation layer; a first electrode on the organic layer; a second passivation layer on the first electrode; a second electrode on the second passivation layer; and a third passivation layer covering a side surface of an edge of the first electrode. The second passivation layer overlaps the side surface and the edge of the first electrode in a plan view.

The first electrode exposes an edge of the second passivation layer.

An edge of the third passivation layer may substantially coincide with the edge of the second passivation layer.

The gate line may include a gate pad portion, the data line may include a data pad portion, and the thin film transistor array panel may further include a blocking member at a peripheral region of the gate pad portion and the data pad portion, and on the organic layer. The second passivation layer at the peripheral region of the gate pad portion and the data pad portion may overlap an edge of the blocking member at the peripheral region of the gate pad portion and the data pad portion.

The blocking member exposes an edge of the second passivation layer at the peripheral region of the gate pad portion and the data pad portion.

The third passivation layer may cover a side surface at the edge of the blocking member, and an edge of the third passivation layer at the peripheral region of the gate pad portion and the data pad portion may substantially coincide with the edge of the second passivation layer at the peripheral region of the gate pad portion and the data pad portion.

Yet another exemplary embodiment of the invention provides a method of manufacturing a thin film transistor array panel, including: providing a gate line and a data line on an insulation substrate; providing a first passivation layer on the gate line and the data line; providing an organic layer on the first passivation layer; depositing a conductive layer on the organic layer; providing a photosensitive film pattern on the conductive layer; providing a first electrode by etching the conductive layer by using the photosensitive film pattern as a mask; providing an organic film by etching the organic layer by using the photosensitive film pattern as a mask; providing the second passivation layer on the first electrode; and providing a second electrode on the second passivation layer. An edge of the organic layer is exposed by the first electrode.

The providing of the gate line may include providing a gate pad portion connected to the gate line, the providing of the data line may include providing a data pad portion connected to the data line, and the method may further include providing a blocking member at a peripheral region of the gate pad portion and the data pad portion by etching the conductive layer by using the photosensitive film pattern as the mask.

The blocking member at the peripheral region of the gate pad portion and the data pad portion may expose an edge of the organic layer at the peripheral region of the gate pad portion and the data pad portion.

In the method of manufacturing the thin film transistor array panel, one of the first electrode and the second electrode may have a planar shape, and the other the first electrode and the second electrode may include a branch electrode.

The providing of the gate lines or the providing of the data lines may further include providing a common voltage line. The providing of the organic film and the first electrode may further include defining an opening exposing a portion of the common voltage line, the providing of the second passivation layer may further include defining a contact hole exposing the first electrode, and the method may further include providing a connecting member covering the common voltage line exposed through the opening and the first electrode exposed through the contact hole.

The connecting member may be in a same layer as that of the second electrode.

Still another exemplary embodiment of the invention provides a method of manufacturing a thin film transistor array panel, including: providing a gate line and a data line on an insulation substrate; providing a first passivation layer on the gate line and the data line; providing an organic layer on the first passivation layer; depositing a conductive layer on the organic layer; depositing an insulating layer on the conductive layer; providing a photosensitive film pattern on the insulating layer; providing a second passivation layer by etching the insulating layer by using the photosensitive film pattern as a mask; providing a first electrode by etching the conductive layer by using the photosensitive film pattern as a mask; providing a third passivation layer covering a side surface of an edge of the first electrode; and providing a second electrode on the second passivation layer and the third passivation layer.

The providing the first electrode may include etching the conductive layer so that the first electrode exposes an edge of the second passivation layer.

The providing of the third passivation layer may include providing the third passivation layer so that an edge of the third passivation layer substantially coincides with the edge of the second passivation layer.

The providing of the gate line may include providing the gate pad portion connected to the gate line, the providing of the data line may include providing a data pad portion connected to the data line, and the method may further include providing a blocking member at the peripheral region of the gate pad portion and the data pad portion by etching the conductive layer by using the photosensitive film pattern as the mask. In the method of manufacturing the thin film transistor array panel, the second passivation layer at the peripheral region of the gate pad portion and the data pad portion may overlap an edge of the blocking member at the peripheral region of the gate pad portion and the data pad portion.

In the method of manufacturing the thin film transistor array panel, the blocking member exposes an edge of the second passivation layer at the peripheral region of the gate pad portion and the data pad portion.

The providing of the third passivation layer may further include providing a fourth passivation layer covering a side surface at the edge of the blocking member, and an edge of the fourth passivation layer at the peripheral region of the gate pad portion and the data pad portion may substantially coincide with the edge of the second passivation layer at the peripheral region of the gate pad portion and the data pad portion.

According to one or more exemplary embodiment of the thin film transistor array panel and the method of manufacturing the same according to the invention, it is possible to reduce or effectively prevent an increase in manufacturing cost even when providing two field generating electrodes on a single substrate of one display panel.

BRIEF DESCRIPTION OF THE DRAWINGS

The above and other features of this disclosure will become more apparent by describing in further detail exemplary embodiments thereof with reference to the accompanying drawings, in which:

FIGS. 6, 9, 12, 15, 18, 21, 24, 27 and 30 are cross-sectional views sequentially illustrating the exemplary embodiment of the method of manufacturing the thin film transistor array panel according to the invention, I taken along line III-III of FIG. 1.

DETAILED DESCRIPTION

Figure 1:
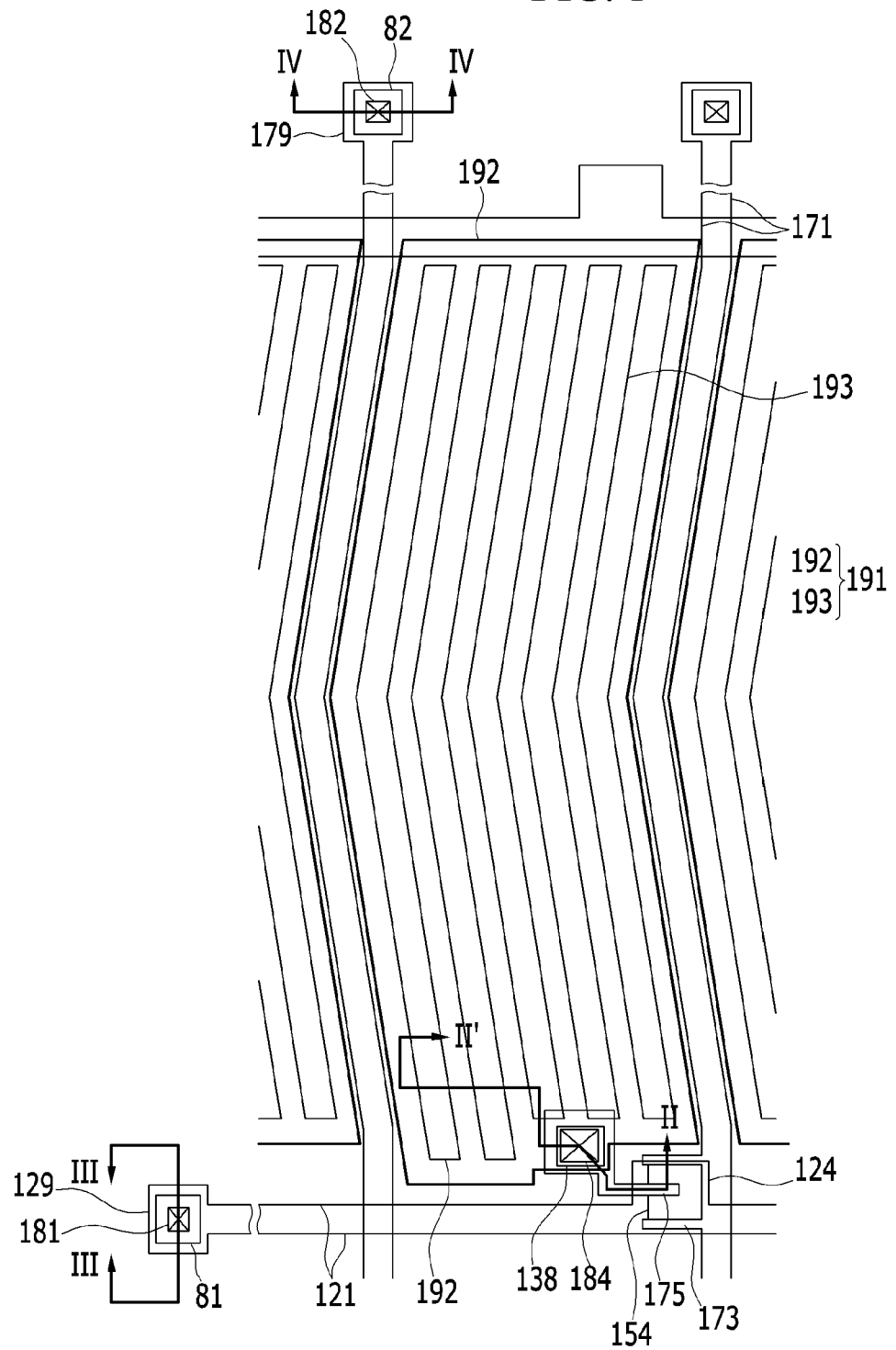
FIG. 1 is a plan view of an exemplary embodiment of a thin film transistor array panel according to the invention.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. As used herein, connected may refer to elements being physically and/or electrically connected to each other. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "under" relative to other elements or features would then be oriented "above" relative to the other elements or features. Thus, the exemplary term "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

As a method of implementing a wide viewing angle, a liquid crystal display includes a display panel in which field generating electrodes such as a pixel electrode and a common electrode are disposed on one single substrate of the display panel has attracted attention.

According to the liquid crystal display having the aforementioned structural elements, a plurality of cutout portions are defined in at least one of the two field generating electrodes among the pixel electrode and the common electrode therein, and the respective field generating electrode includes a plurality of branch electrodes defined by the plurality of cutout portions. Where the two field generating electrodes are disposed in one display panel including the one single substrate, in order to form each field generating electrode in a manufacturing process of the display panel, different photo masks are necessary and thus manufacturing cost is undesirably increased. Therefore, there remains a need for an improved display device and method of manufacturing thereof, which is simplified and has a reduced cost.

Figure 2:
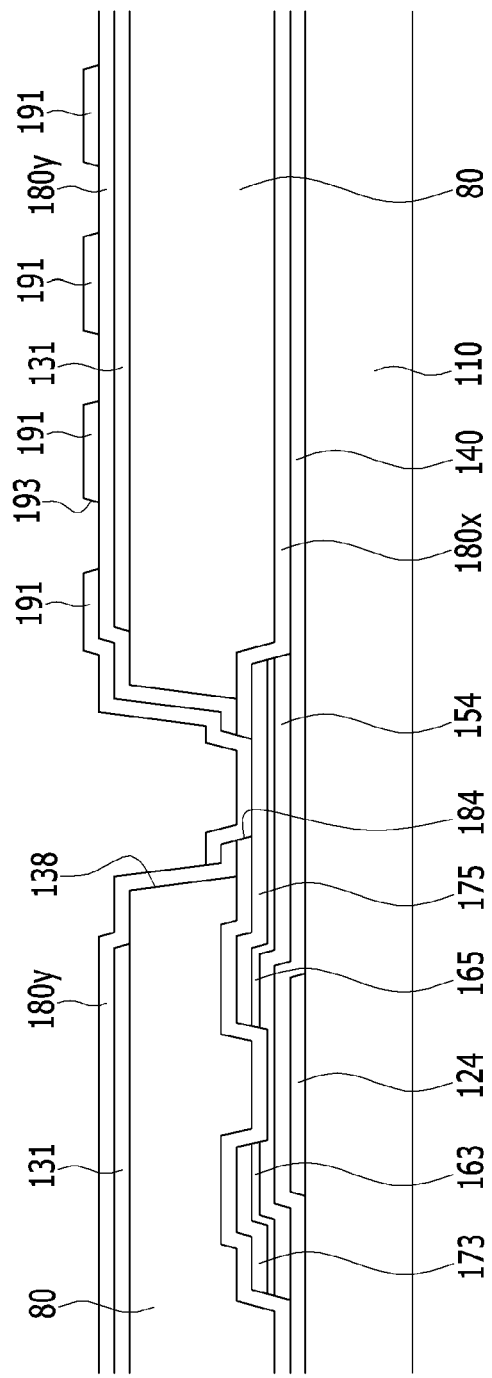
FIG. 2 is a cross-sectional view illustrating the thin film transistor array panel taken along line II-II' of FIG. 1.
Figure 3:
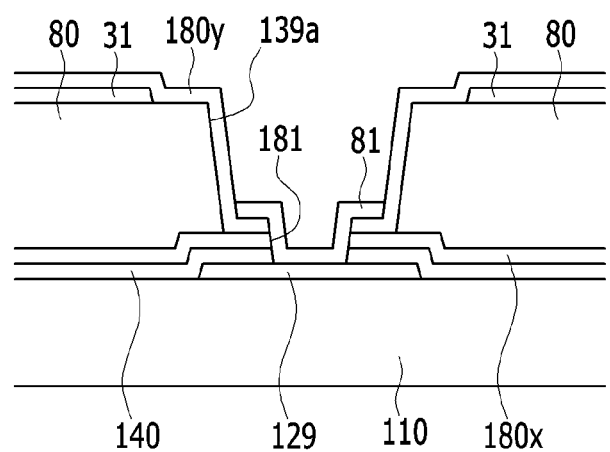
FIG. 3 is a cross-sectional view illustrating the thin film transistor array panel taken along line III-III of FIG. 1.
Figure 4:
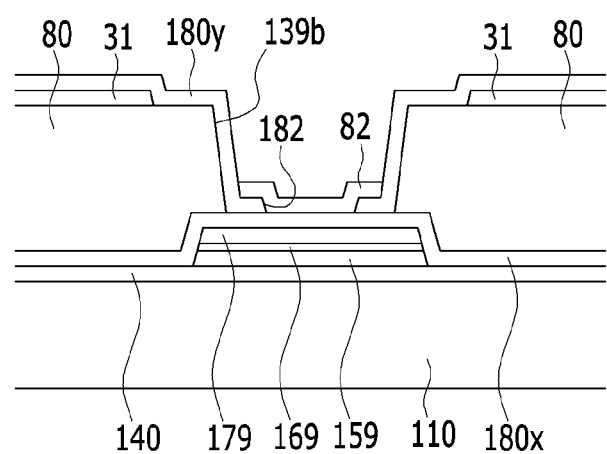
FIG. 4 is a cross-sectional view illustrating the thin film transistor array panel taken along line IV-IV of FIG. 1.

First, an exemplary embodiment of a thin film transistor array panel of a liquid crystal display according to the invention will be described with reference to FIGS. 1 to 4. FIG. 1 is a plan view of an exemplary embodiment of a thin film transistor array panel according to the invention, FIG. 2 is a cross-sectional view illustrating the thin film transistor array panel taken along line II-II' of FIG. 1, FIG. 3 is a cross-sectional view illustrating the thin film transistor array panel taken along line III-III of FIG. 1, and FIG. 4 is a cross-sectional view illustrating the thin film transistor array panel taken along line IV-IV of FIG. 1.

Referring to FIGS. 1 to 4, one or more gate line 121 is disposed on an insulation substrate 110.

Each gate line 121 of a plurality of gate lines 121 includes a wide gate pad portion 129 at a distal end thereof, and a plurality of gate electrodes 124 protruding from a main portion thereof. The wide gate pad portion 129 connects the plurality of gate electrodes 124 with another layer of the thin film transistor array panel or an external driving circuit (not shown). A gate driving circuit (not illustrated) generating a gate signal may be mounted on a flexible printed circuit film (not illustrated) attached to the insulation substrate 110, or may be directly mounted on the insulation substrate 110.

A gate conductor includes the gate line 121, the gate electrode 124 and the wide gate pad portion 129. The elements of the gate conductor are in a same layer of the thin film transistor array panel, and may have a single layer structure, or a multilayer structure including two or more conductive layers.

The gate insulating layer 140 is disposed on the gate conductor 121, 124 and 129. The gate insulating layer 140 may include an inorganic insulating material, such as silicon nitride (SiNx) or silicon oxide (SiOx).

A semiconductor 154 is disposed on the gate insulating layer 140. Ohmic contacts 163 and 165 are disposed on the semiconductor 154.

The semiconductor 154 may include an oxide semiconductor. Where the semiconductor 154 is an oxide semiconductor, the ohmic contacts 163 and 165 may be omitted.

A data conductor including one or more data line 171 and one or more drain electrode 175 is disposed on the ohmic contacts 163 and 165.

Referring to FIG. 1, the data line 171 transmits a data signal, and mainly extends in a vertical direction to intersect the gate line 121. Each of a plurality of data lines 171 includes a source electrode 173 extending toward a gate electrode 124, and a wide data pad portion 179 for connecting the data line 171 to another layer of the thin film transistor array panel or to an external driving circuit. A data driving circuit (not illustrated) for generating a data signal may be mounted on a flexible printed circuit film (not illustrated) attached to the insulation substrate 110, or may be directly mounted on the insulation substrate 110.

In the plan view, the drain electrode 175 includes an elongated rod-shaped first end portion facing the source electrode 173 with respect to the gate electrode 124, and a wide planar area second end portion opposite to the first end portion.

A first semiconductor 159 and a first ohmic contact 169 are disposed under the data pad portion 179. In an alternative exemplary embodiment, the first semiconductor 159 and the first ohmic contact 169 may be omitted.

The data conductor 171, 173, 175 and 179 may have a single layer structure, or a multilayer structure including two or more conductive layers.

The gate electrode 124, the source electrode 173 and the drain electrode 175 form a thin film transistor ("TFT") together with the semiconductor 154. The semiconductor 154 is exposed between the source and drain electrodes 173 and 175, and forms a channel of the TFT. The TFT may otherwise be referred to as a switching element. The semiconductor 154 may have substantially the same plane shape as those of the data conductor 171, 173, 175, and 179 except for a channel portion of the TFT.

A first passivation layer 180x is disposed on the data conductor 171, 173, 175 and 179, and the exposed semiconductor 154. The first passivation layer 180x may include an organic insulating material or an inorganic insulating material.

An organic film 80 is disposed on the first passivation layer 180x. The organic film 80 has a larger cross-sectional thickness than that of the first passivation layer 180x. The organic film 80 may have a substantially flat surface to planarize underlying layers of the TFT array panel.

A common electrode 131 and a blocking member 31 are disposed on the organic film 80. The common electrode 131 and the blocking member 31 may include a transparent conductive material, such as indium tin oxide ("ITO") or indium zinc oxide ("IZO"). The common electrode 131 and the blocking member 31 may be in a same layer of the TFT array panel.

The liquid crystal display includes a display region in which a plurality of pixels is disposed to display an image, and a non-display (e.g., peripheral) region in which the image is not displayed. The common electrode 131 is disposed in the display region, and the blocking member 31 is disposed in the peripheral region along with the gate pad portion 129 and the data pad portion 179.

The organic film 80, and the common electrode 131 and the blocking member 31 disposed on the organic film 80, may have substantially the same plane shape as each other. More particularly, edges or boundaries of the common electrode 131 and the blocking member 31 substantially meet and may be aligned with an edge of the organic film 80, but the invention is not limited thereto. An edge of the organic layer 80 may be exposed by the common electrode 131 and the blocking member 31, such that edges of the common electrode 131 and the blocking member 31 overlap the organic film 80. In an exemplary embodiment of manufacturing the liquid crystal display device, the organic film 80, and the common electrode 131 and the blocking member 31 disposed on the organic film 80, are simultaneously formed (e.g., provided) such as through a single photolithography process.

A first opening 138 is defined in the organic film 80 and the common electrode 131 at a position overlapping a portion of the drain electrode 175.

A second opening 139a is defined in the organic film 80 and the blocking member 31 at a position overlapping a portion of the gate pad portion 129, and a third opening 139b is defined in the organic film 80 and the blocking member 31 at a position overlapping a portion of the data pad portion 179.

A second passivation layer 180y is disposed on the common electrode 131 and the blocking member 31. The second passivation layer 180y may include an organic insulating material or an inorganic insulating material.

A first contact hole 184 is defined in the second passivation layer 180y and the first passivation layer 180x and exposes a portion of the drain electrode 175. The first contact hole 184 is disposed inside the first opening 138 defined in the organic film 80 and the common electrode 131. The first contact hole 184 is aligned with the first opening 138.

A second contact hole 181 is defined in the second passivation layer 180y, the first passivation layer 180x and the gate insulating layer 140 and exposes the gate pad portion 129. The second contact hole 181 is disposed inside the second opening 139a defined in the organic film 80 and the blocking member 31. The second contact hole 181 is aligned with the second opening 139a.

A third contact hole 182 is defined in the second passivation layer 180y and the first passivation layer 180x and exposes the data pad portion 179. The third contact hole 182 is disposed inside the third opening portion 139b defined in the organic film 80 and the blocking member 31. The third contact hole 182 is aligned with the third opening 139b.

A pixel electrode 191, a first contact assistant 81 and a second contact assistant 82 are disposed on the second passivation layer 180y. The pixel electrode 191, the first contact assistant 81 and the second contact assistant 82 may include a transparent conductive material, such as ITO or IZO. The pixel electrode 191, the first contact assistant 81 and the second contact assistant 82 may be in a same layer of the TFT array panel.

The pixel electrode 191 is electrically connected with the drain electrode 175 through the first contact hole 184 to receive a data voltage. The pixel electrode 191 includes a plurality of branch electrodes 193 generally extended in the vertical direction, parallel to each other and spaced apart from each other, and lower and upper horizontal portions 192 connecting upper and lower end portions of the branch electrodes 193. The branch electrodes 193 of the pixel electrode 191 may be parallel to the data lines 171. Where the data lines 171 are bent, the branch electrodes 193 may also be bent and extend along the data lines 171. The branch electrodes 193 may be defined by openings or cutouts defined in the pixel electrode 191.

The first contact assistant 81 is disposed on the gate pad portion 129 exposed through the second contact hole 181, and the second contact assistant 82 is disposed on the data pad portion 179 exposed through the third contact hole 182.

The pixel electrode 191 receiving the data voltage generates an electric field in a liquid crystal layer disposed on the TFT array panel, together with the common electrode 131 receiving a common voltage.

According to an exemplary embodiment of manufacturing the TFT array panel according to the invention, the organic film 80, and the common electrode 131 and the blocking member 31 disposed on the organic film 80, may be formed together by using one photo mask. Accordingly, it is possible to reduce or effectively prevent an increase in manufacturing cost of the liquid crystal display. Further, since the organic film 80, and the common electrode 131 and the blocking member 31 disposed on the organic film 80, have substantially the same plane shape, it is possible to reduce or effectively prevent a decrease in a planar area of the common electrode 131 compared to a case where an opening is defined in the common electrode 131 to be wider than an opening defined in the organic film 80. Further, it is possible to reduce or effectively prevent static electricity and the like introduced from outside the liquid crystal display from being introduced to a signal line by disposing the blocking member 31 in a peripheral region of the gate pad portion 129 and the data pad portion 179. The signal line may include the gate line 121 and/or the data line 171.

According to the exemplary embodiment of the TFT array panel according to the invention, any one of the common electrode 131 and the pixel electrode 191 may have the branch electrode, and the other one may have a planar shape, but the invention is not limited thereto. As the planar shape, an electrode may be a single, unitary, indivisible member and/or disposed on an entire of a substrate, without an opening defined therein. The branch electrodes may be defined by openings or cutouts defined in the respective electrode.

An exemplary embodiment of a method of manufacturing the TFT array panel according to the invention will be descried with reference to FIGS. 5 to 31 together with FIGS. 1 to 4. FIGS. 5, 8, 11, 14, 17, 20, 23, 26 and 29 are cross-sectional views illustrating an exemplary embodiment of a method of manufacturing the TFT array panel according to the invention, taken along line II-II' of FIG. 1. FIGS. 6, 9, 12, 15, 18, 21, 24, 27 and 30 are cross-sectional views illustrating the exemplary embodiment of the method of manufacturing the TFT array panel according to the invention, taken along line III-III of FIG. 1. FIGS. 7, 10, 13, 16, 19, 22, 25, 28 and 31 are cross-sectional views illustrating the exemplary embodiment of the method of manufacturing the TFT array panel according to the invention, taken along line IV-IV of FIG. 1.

Figure 5:
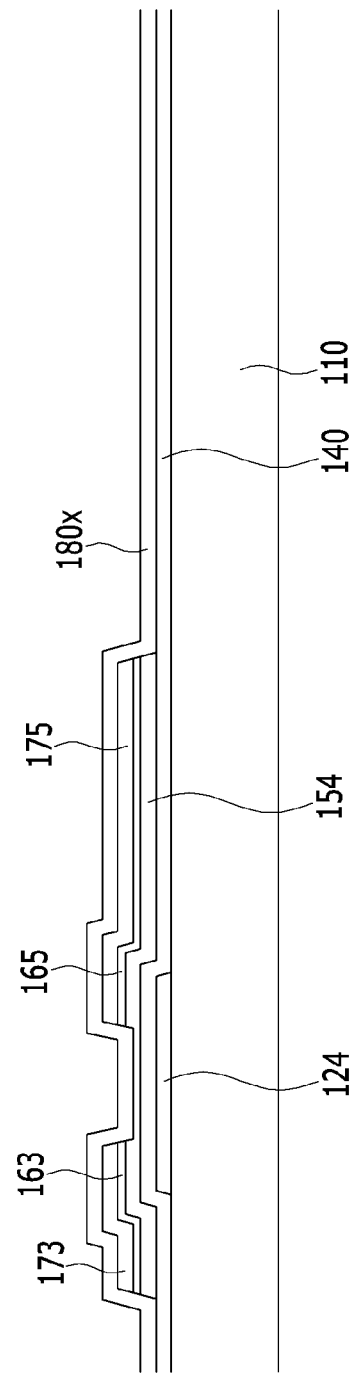
FIGS. 5, 8, 11, 14, 17, 20, 23, 26 and 29 are cross-sectional views illustrating an exemplary embodiment of a method of manufacturing the thin film transistor array panel according to the invention, taken along line II-II' of FIG. 1.
Figure 6:
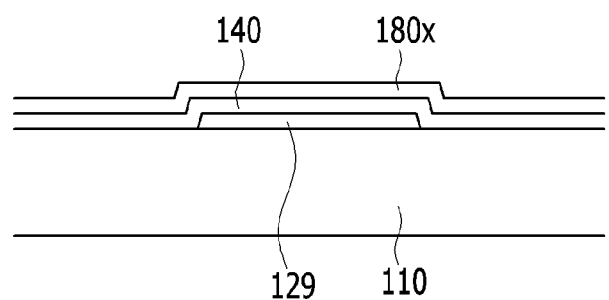
Figure 7:
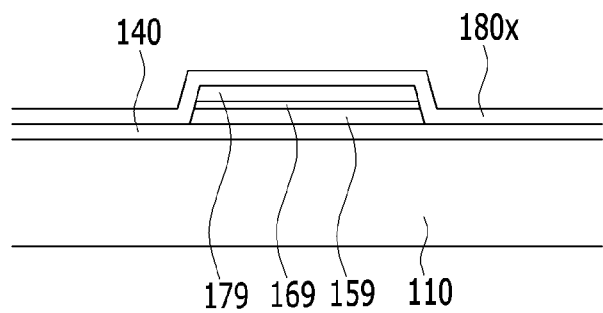
FIGS. 7, 10, 13, 16, 19, 22, 25, 28 and 31 are cross-sectional views sequentially illustrating the exemplary embodiment of the method of manufacturing the thin film transistor array panel according to the invention, taken along line IV-IV of FIG. 1.

Referring to FIGS. 5 to 7, the gate conductor 121, 124 and 129 including the gate line 121, the gate electrode 124 and the gate pad portion 129 is formed (e.g., provided) on the insulation substrate 110, and the gate insulating layer 140 is deposited on the gate conductor 121, 124 and 129. The semiconductor 154, the first semiconductor 159, the ohmic contacts 163 and 165, the first ohmic contact 169 and the data conductor 171, 173, 175, and 179 including the data line 171, the source electrode 173, the drain electrode 175 and the data pad portion 179 are formed on the gate insulating layer 140.

The first passivation layer 180x is deposited on the data conductor 171, 173, 175 and 179, and the exposed semiconductor 154.

Figure 8:
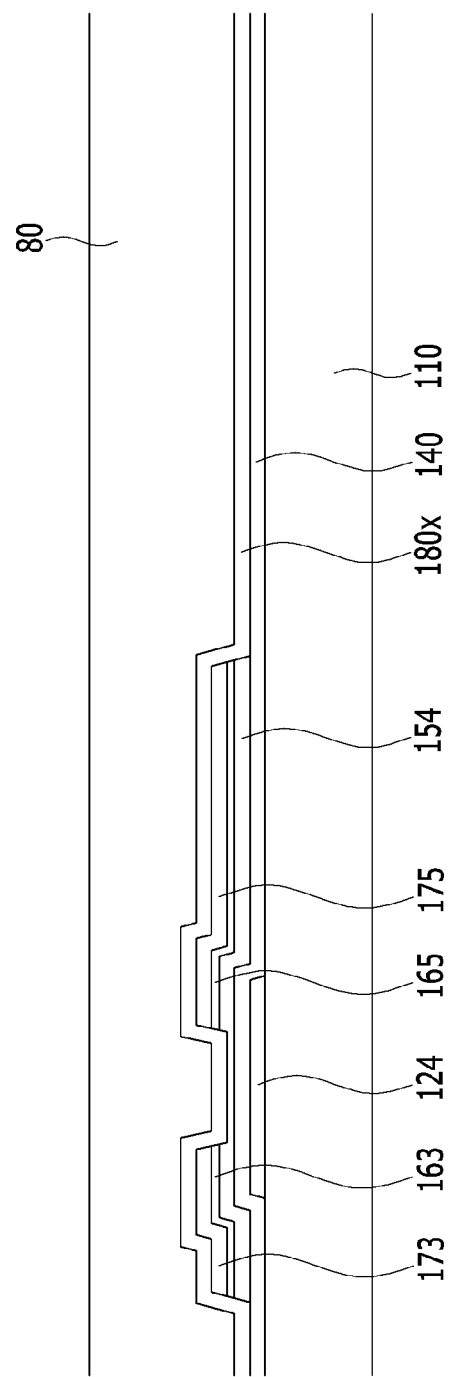
Figure 9:
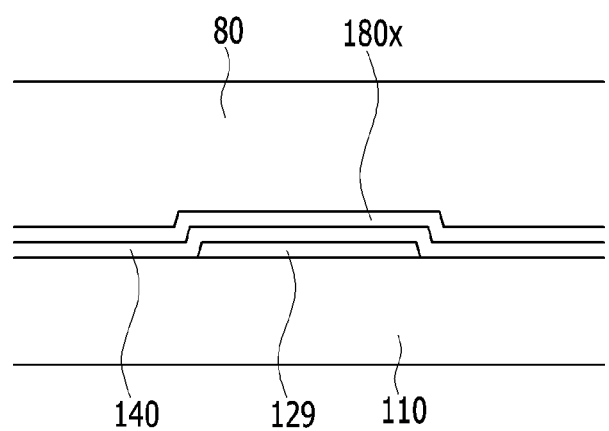
Figure 10:
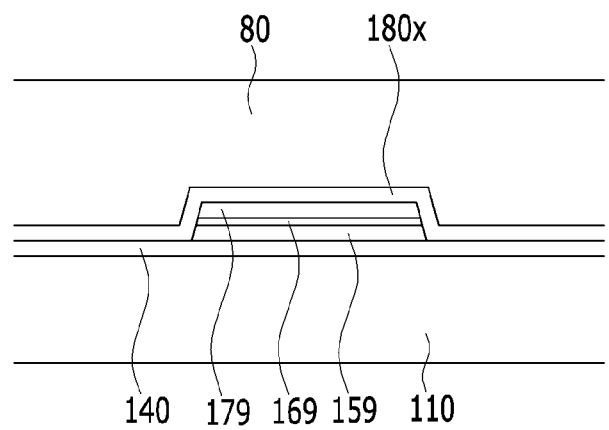

As illustrated in FIGS. 8 to 10, the organic film 80 is deposited on the first passivation layer 180x.

Figure 11:
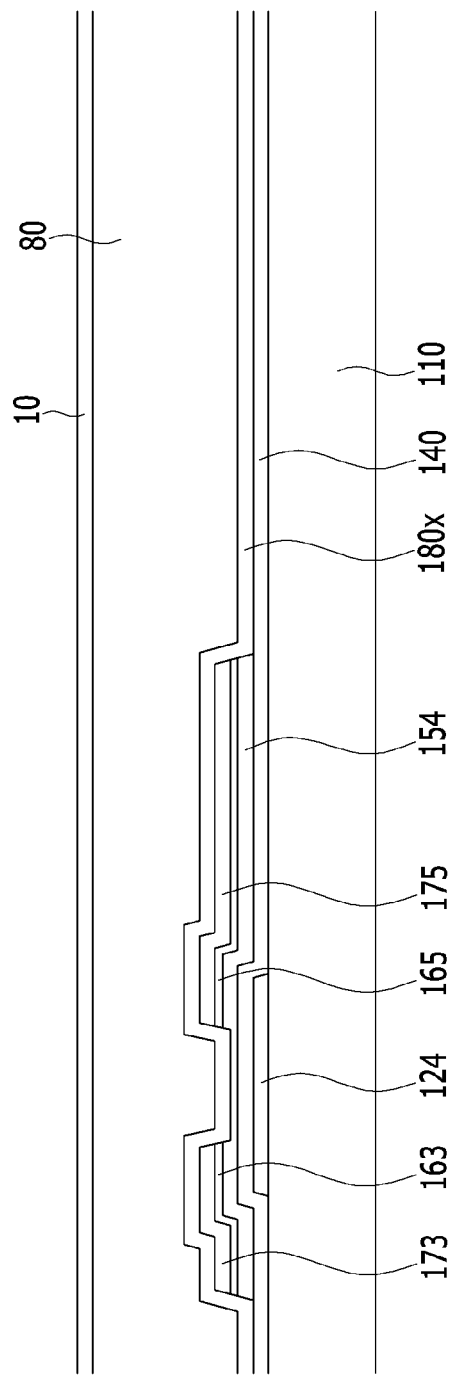
Figure 12:
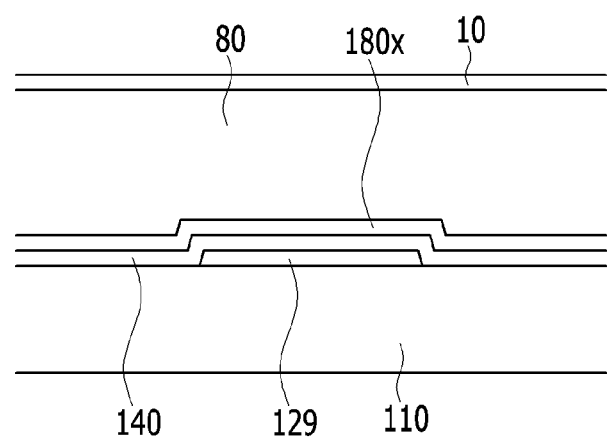
Figure 13:
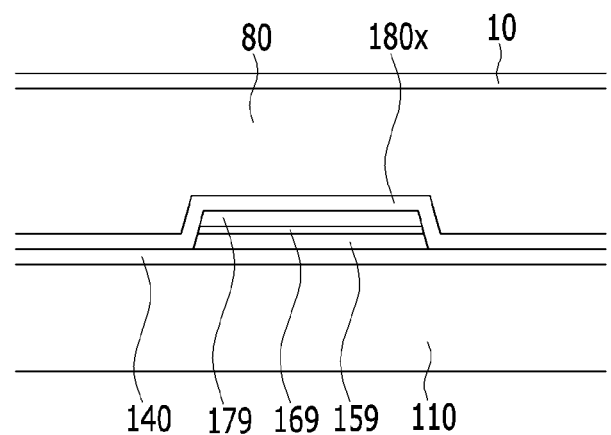

Referring to FIGS. 11 to 13, a first conductive layer 10 is deposited on the organic film 80.

Figure 14:
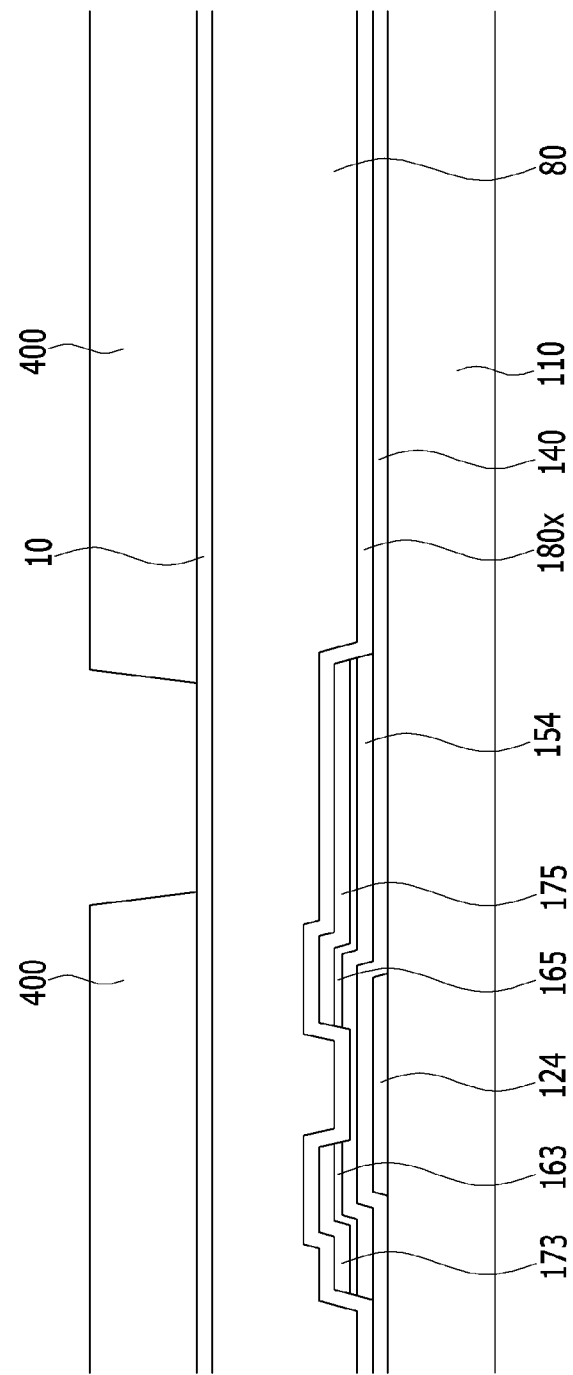
Figure 15:
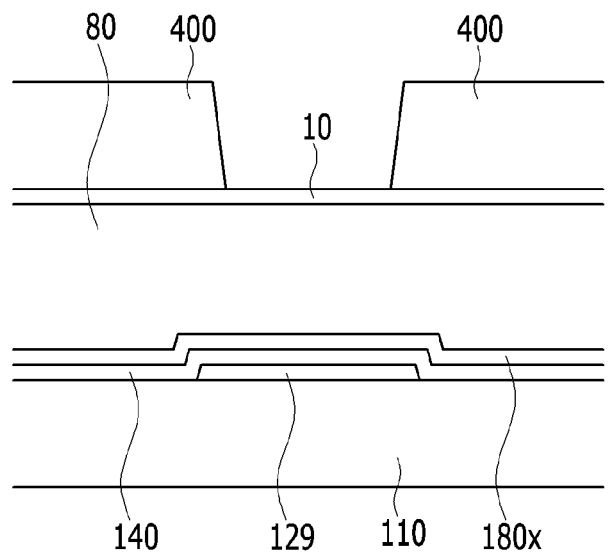
Figure 16:
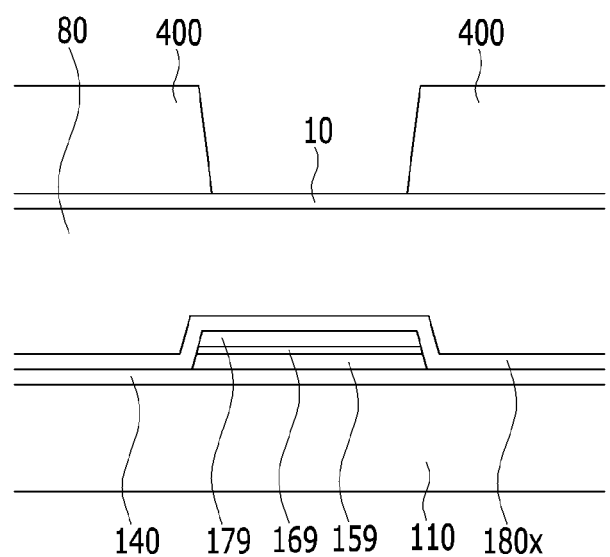

As illustrated in FIGS. 14 to 16, a photosensitive film is deposited and then exposed and developed to form a first photosensitive film pattern 400.

Figure 17:
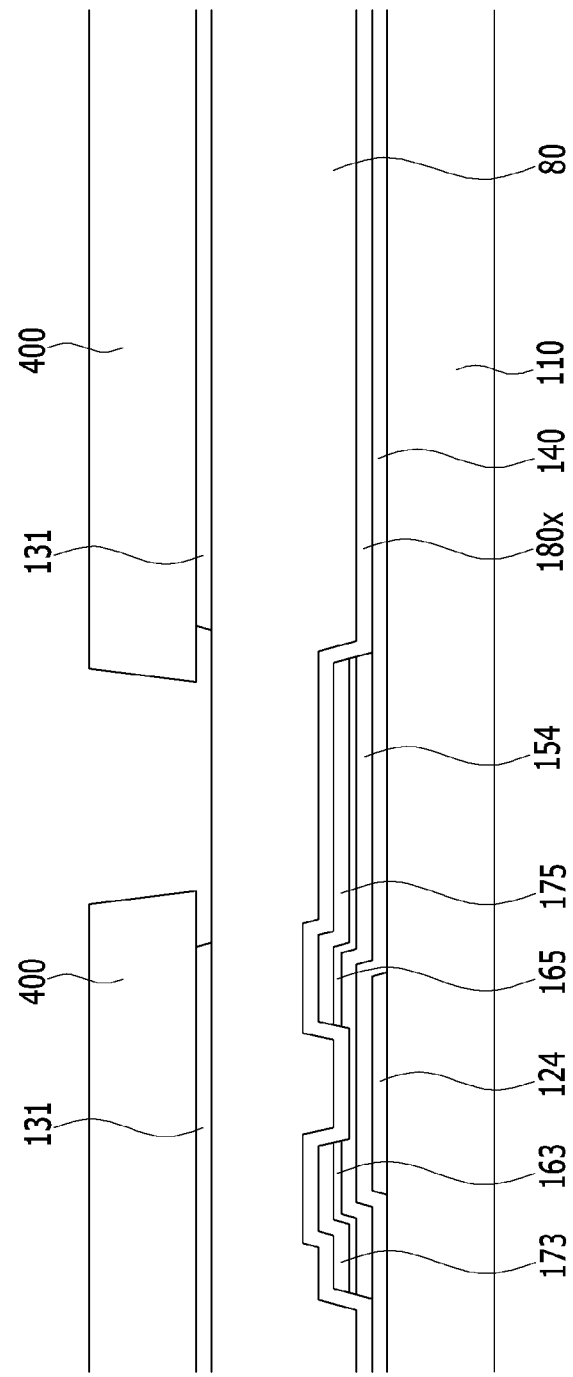
Figure 19:
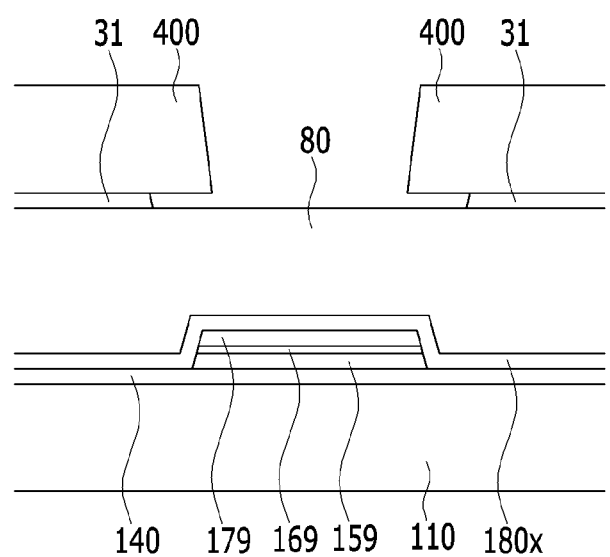

As illustrated in FIGS. 17 to 19, the first conductive layer 10 is etched by using the first photosensitive film pattern 400 as a mask to form the common electrode 131 and the blocking member 31.

Figure 20:
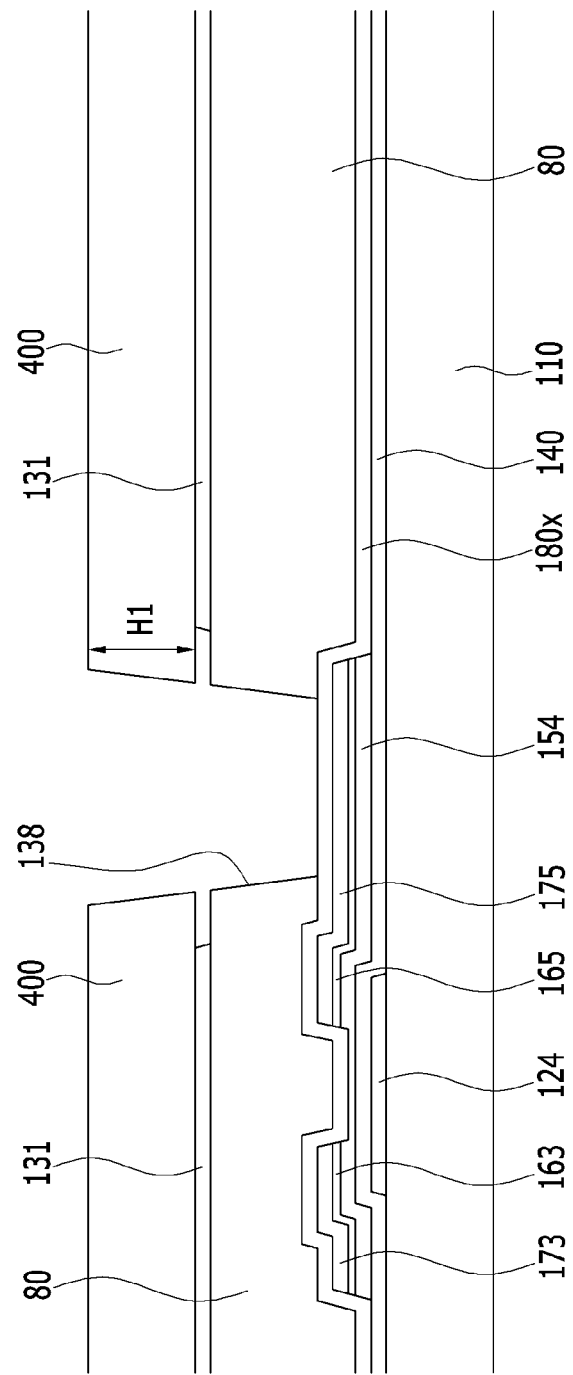
Figure 21:
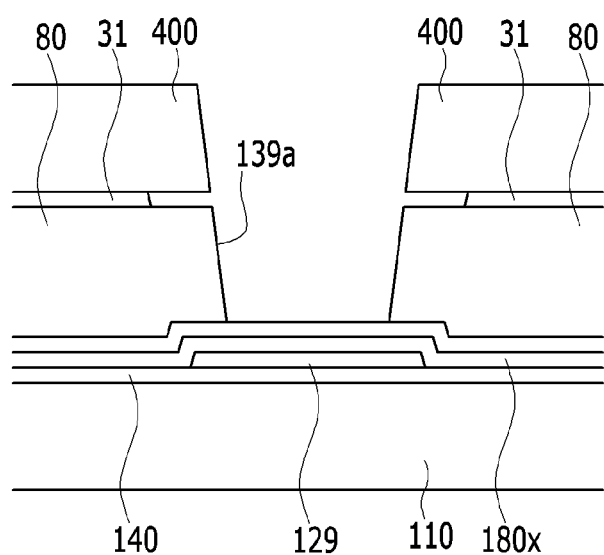
Figure 22:
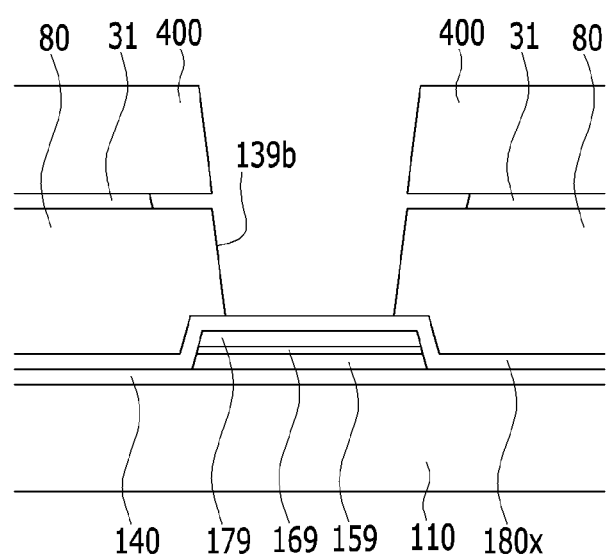

Referring to FIGS. 20 to 22, the first opening 138 at the position overlapping the part of the drain electrode 175, the second opening 139a at the position overlapping the part of the gate pad portion 129, and the third opening 139b at the position overlapping the part of the data pad portion 179 are defined in the organic film 80 such as through ashing the organic film 80 by using the common electrode 131 and the blocking member 31 as a mask.

In defining the first opening 138, the second opening 139a and the third opening 139b, a portion of the first photosensitive film pattern 400 is ashed together with the organic film 80, so that a height of the first photosensitive film pattern 400 is decreased from an original height thereof to be a first height H1. The first height H1 may be approximately 2.5 micrometers (μm) or more. The first height H1 of the first photosensitive film pattern 400 is maintained, so that it is possible to prevent haze of the common electrode 131 and the blocking member 31 disposed under the organic film 80.

Figure 23:
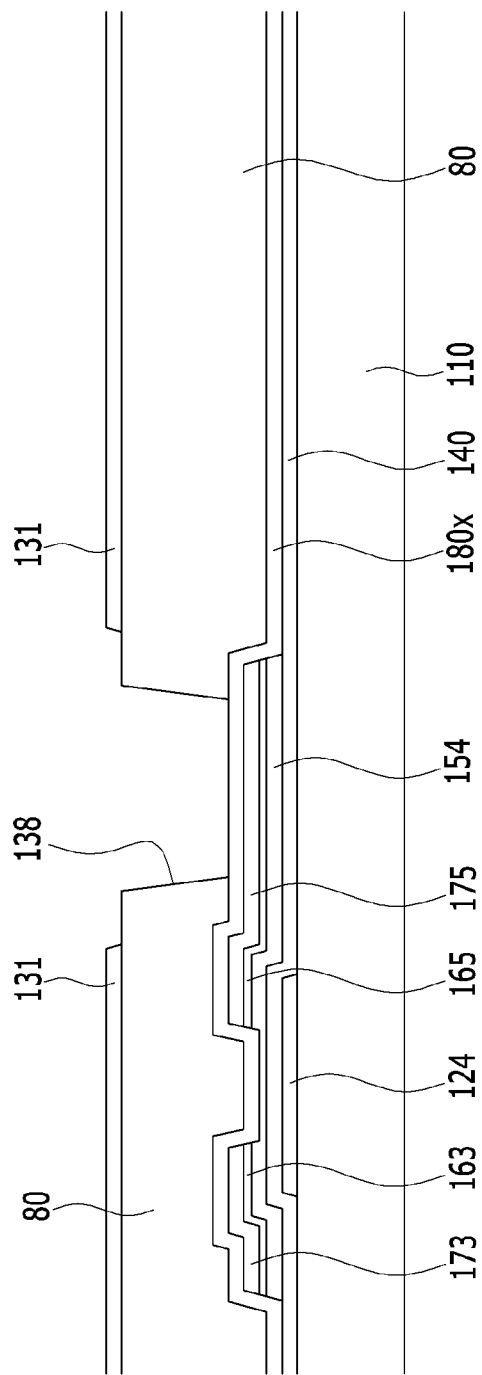
Figure 24:
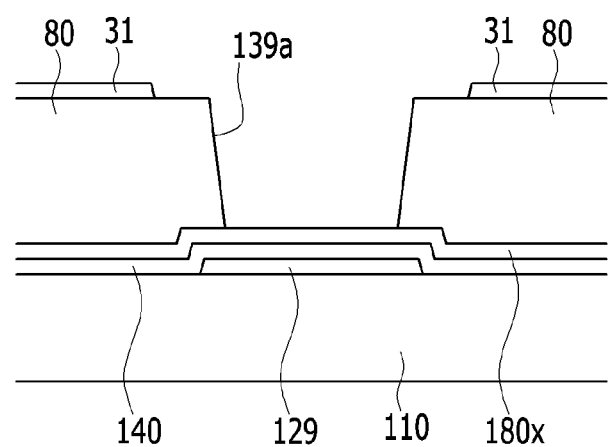
Figure 25:
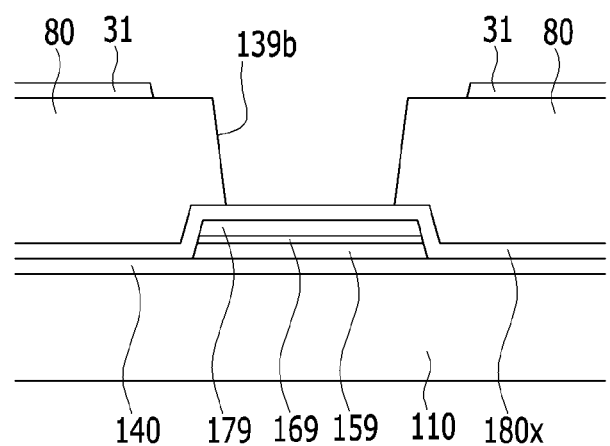

As illustrated in FIGS. 23 to 25, the first photosensitive film pattern 400 is removed.

Figure 26:
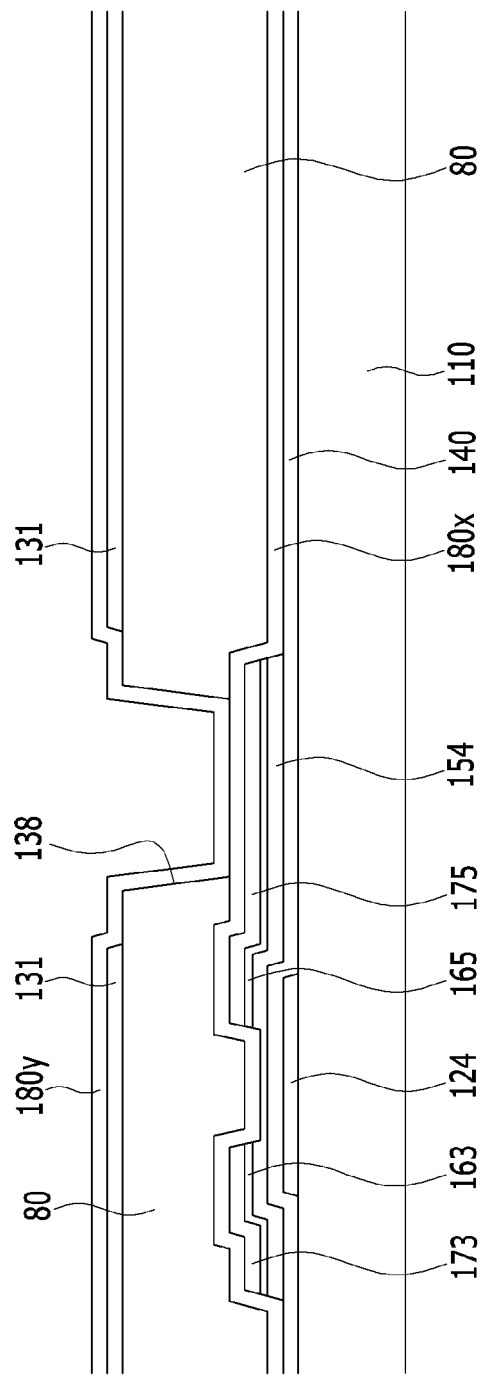
Figure 27:
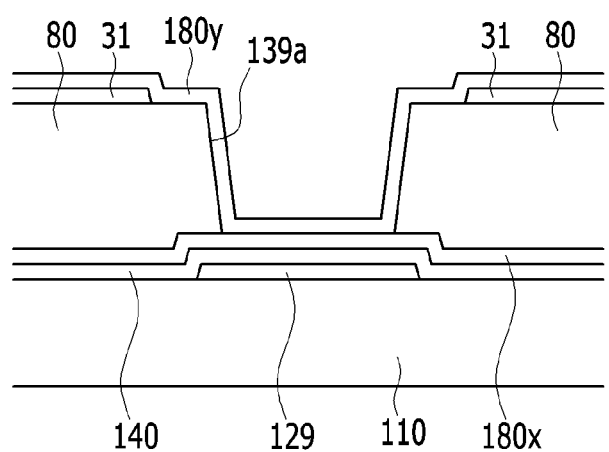
Figure 28:
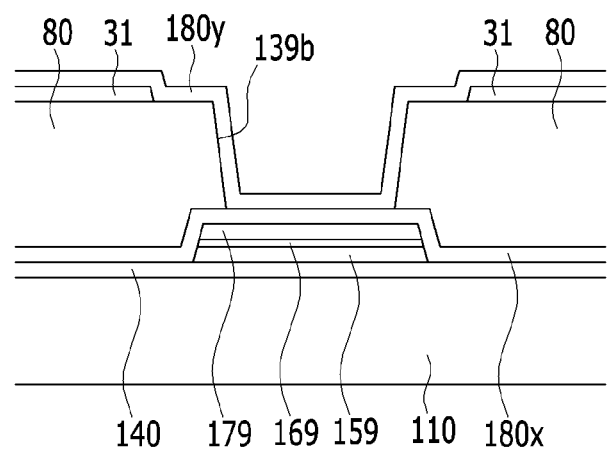

Referring to FIGS. 26 to 28, the second passivation layer 180y is deposited on the organic film 80 and the blocking member 31.

Figure 29:
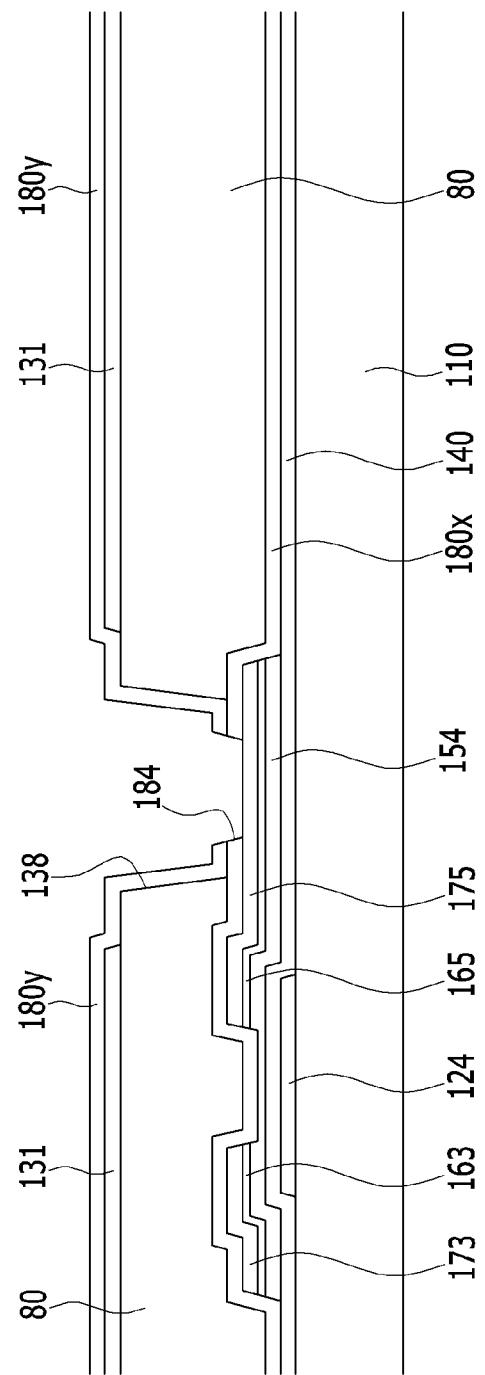
Figure 30:
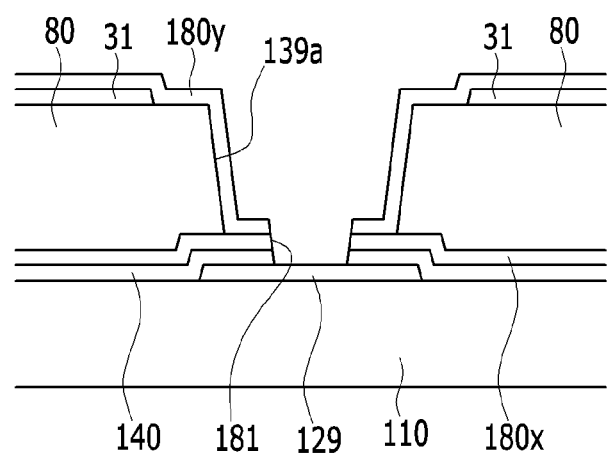
Figure 31:
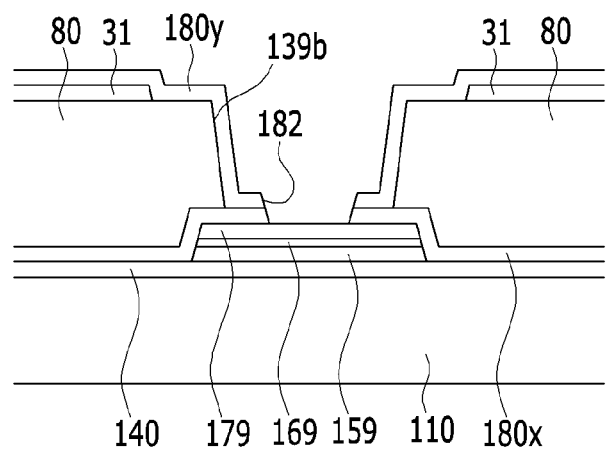

Then, as illustrated in FIGS. 29 to 31, the first contact hole 184 exposing a portion of the drain electrode 175 is defined in the second passivation layer 180y and the first passivation layer 180x, the second contact hole 181 exposing the gate pad portion 129 is defined in the second passivation layer 180y, the first passivation layer 180x, and the gate insulating layer 140 and the third contact hole 182 exposing the data pad portion 179 is defined in the second passivation layer 180y and the first passivation layer 180x.

The first contact hole 184 is disposed inside the first opening 138 defined in the organic film 80 and the common electrode 131, the second contact hole 181 is disposed inside the second opening 139a defined in the organic film 80 and the blocking member 31, and the third contact hole 182 is disposed inside the third opening 139b defined in the organic film 80 and the blocking member 31.

Referring again to FIGS. 2 to 4, the pixel electrode 191, the first contact assistant 81 and the second contact assistant 82 are formed on the second passivation layer 180y.

The pixel electrode 191 is electrically connected with the drain electrode 175 through the first contact hole 184. The first contact assistant 81 is disposed on the gate pad portion 129 exposed through the second contact hole 181, and the second contact assistant 82 is disposed on the data pad portion 179 exposed through the third contact hole 182.

According to the exemplary embodiment of the method of manufacturing the TFT array panel according to the invention, the organic film 80, and the common electrode 131 and the blocking member 31 disposed on the organic film 80, are formed together by using one photo mask. Accordingly, it is possible to reduce or effectively prevent an increase of manufacturing cost of the liquid crystal display.

Figure 32:
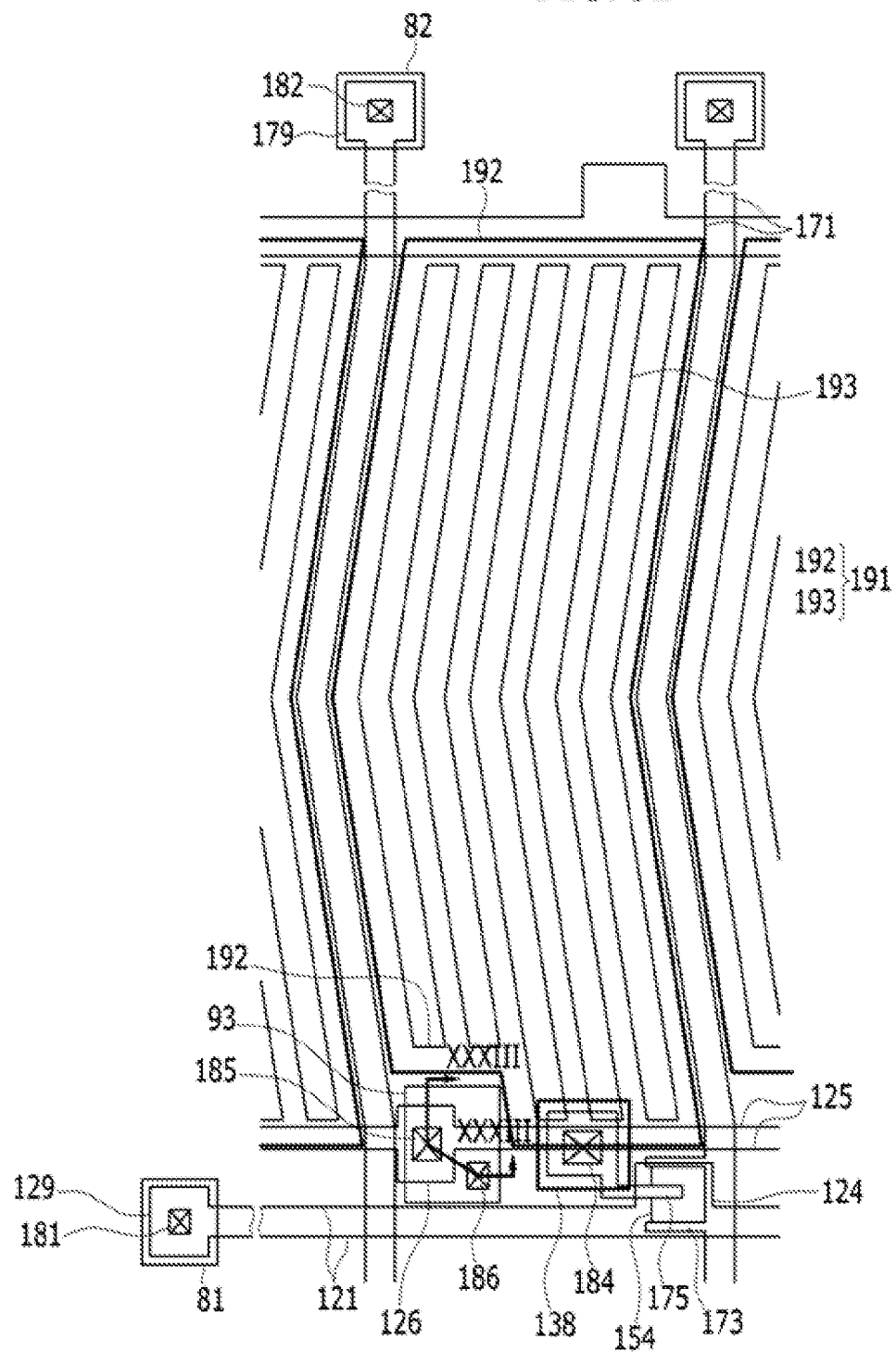
FIG. 32 is a plan view of another exemplary embodiment of a thin film transistor array panel according to the invention.

Next, another exemplary embodiment of a TFT array panel according to the invention will be described with reference to FIGS. 32 and 33 together with FIGS. 1 to 4. FIG. 32 is a plan view of another exemplary embodiment of a TFT array panel according to the invention, and FIG. 33 is a cross-sectional view illustrating the TFT array panel taken along line XXXIII-XXXIII of FIG. 32.

Referring to FIG. 32, the exemplary embodiment of TFT array panel according to the invention is substantially similar to the exemplary embodiment of the TFT array panel descried with reference to FIGS. 1 to 4.

A detailed description of the same constituent element will be omitted.

Figure 33:
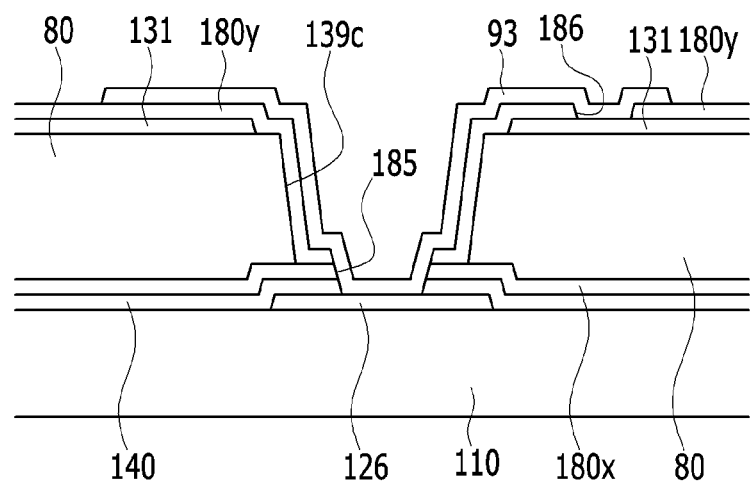
FIG. 33 is a cross-sectional view illustrating the thin film transistor array panel taken along line XXXIII-XXXIII of FIG. 32.

Referring to FIGS. 32 and 33, different from the TFT array panel described with reference to FIGS. 1 to 4, the exemplary embodiment of the TFT array panel in FIGS. 32 and 33 includes one or more common voltage line 125 disposed in and/or on a same layer as that of the gate line 121.

The common voltage line 125 may transmit a predetermined voltage, such as a common voltage, and may be generally extended in a horizontal direction, and substantially parallel to the gate line 121. The common voltage line 125 may include an expansion portion 126.

A gate insulating layer 140, a first passivation layer 180x, an organic film 80, a common electrode 131 and a second passivation layer 180y are sequentially disposed on the common voltage line 125. A fourth opening 139c is defined in the organic film 80 and the common electrode 131 at a position overlapping the expansion portion 126 of the common voltage line 125. Further, a fourth contact hole 185 exposing the expansion portion 126 of the common voltage line 125 is defined in the second passivation layer 180y, the first passivation layer 180x and the gate insulating layer 140, and a fifth contact hole 186 exposing a portion of the common electrode 131 is defined in the second passivation layer 180y. The fourth contact hole 185 is disposed inside the fourth opening 139c defined in the organic film 80 and the common electrode 131.

A first connecting member 93 is disposed on the second passivation layer 180y. The first connecting member 93 is in and/or on a same layer as that of a pixel electrode 191 and is spaced apart from the pixel electrode 191. The first connecting member 93 connects the expansion portion 126 of the common voltage line 125 and the common electrode 131 with each other by covering the expansion portion 126 of the common voltage line 125 exposed through the fourth contact hole 185 and the common electrode 131 exposed through the fifth contact hole 186. Accordingly, a common voltage transmitted through the common voltage line 125 is transmitted to the common electrode 131.

The exemplary embodiment of the TFT array panel according to the invention includes the common voltage line 125 disposed in the same layer as that of the gate line 121, but the invention is not limited thereto. In an alternative exemplary embodiment of a TFT array panel according to the invention, a common voltage line may be disposed in a same layer as that of a data line 171. Where the common voltage line is in the same layer as the data line 171, the contact hole exposing the expansion portion of the common voltage line may be defined in the second passivation layer 180y and the first passivation layer 180x. Further, the common voltage line may be extended along the data line 171 to be side-by-side (e.g., adjacent with) the data line 171.

The many characteristics of the TFT array panel previously described with reference to FIGS. 1 to 4 are applicable to the TFT array panel described with reference to FIGS. 32 and 33.

Still another exemplary embodiment of a TFT array panel according to the invention will be described with reference to FIGS. 34 to 37.

Figure 34:
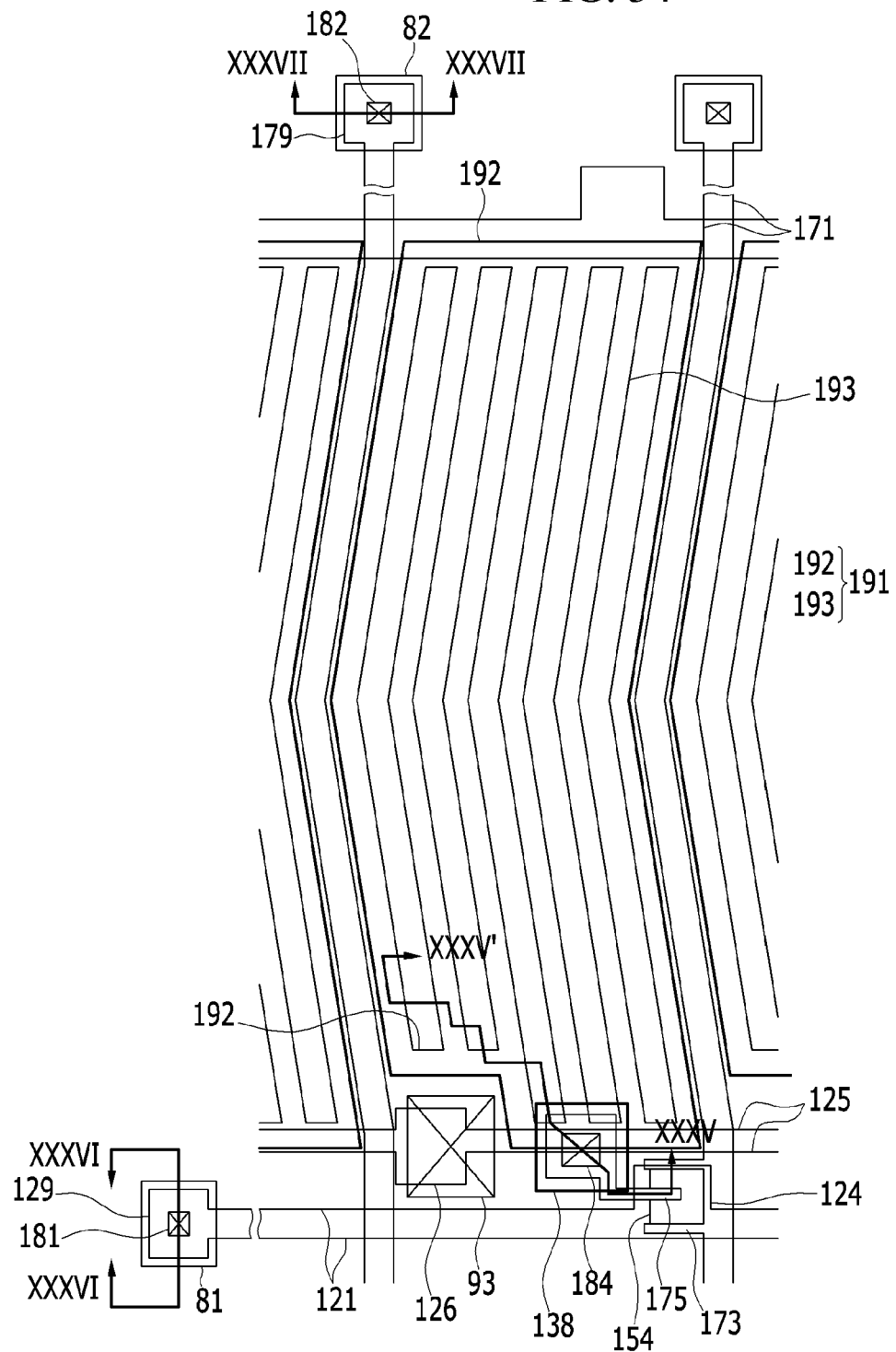
FIG. 34 is a plan view of still another exemplary embodiment of a thin film transistor array panel according to the invention.
Figure 35:
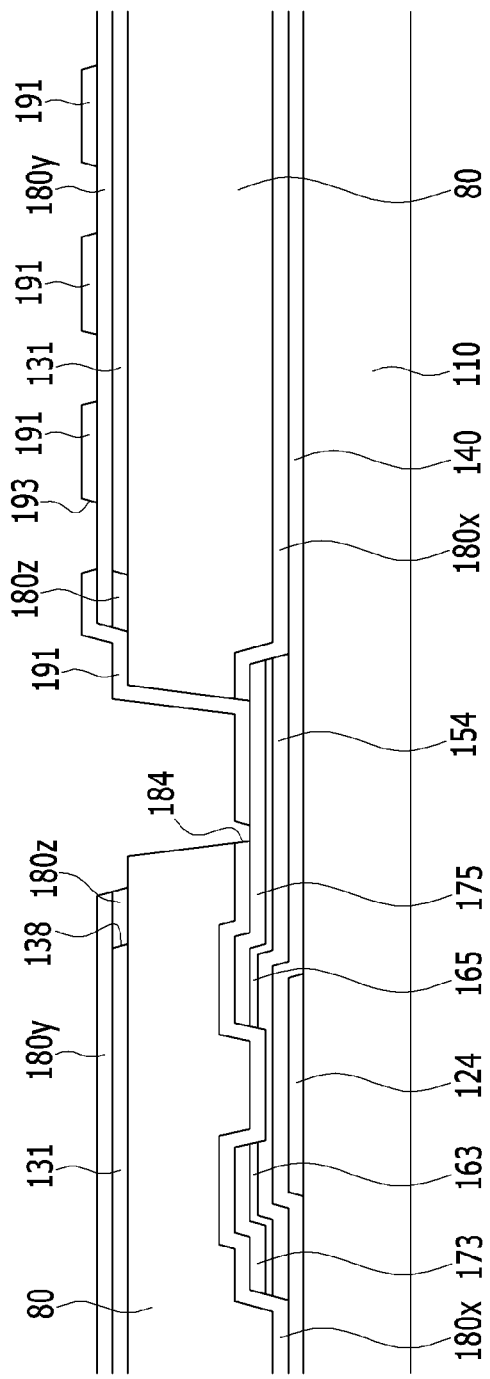
FIG. 35 is a cross-sectional view illustrating the thin film transistor array panel taken along line XXXV-XXXV' of FIG. 34.
Figure 36:
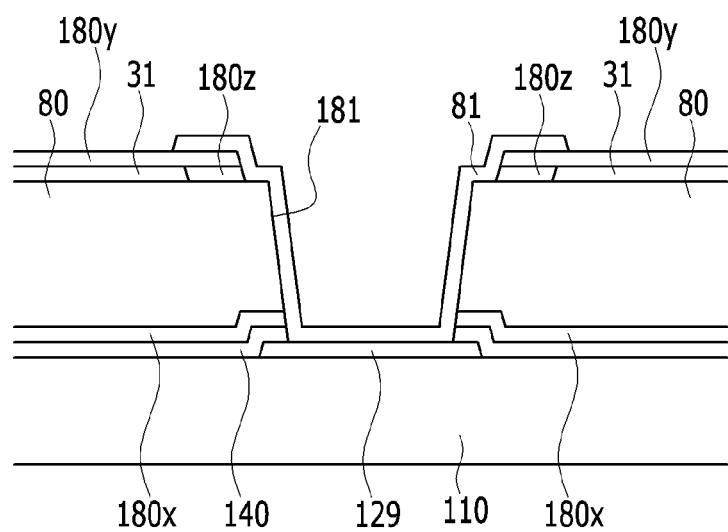
FIG. 36 is a cross-sectional view illustrating the thin film transistor array panel taken along line XXXVI-XXXVI of FIG. 34.
Figure 37:
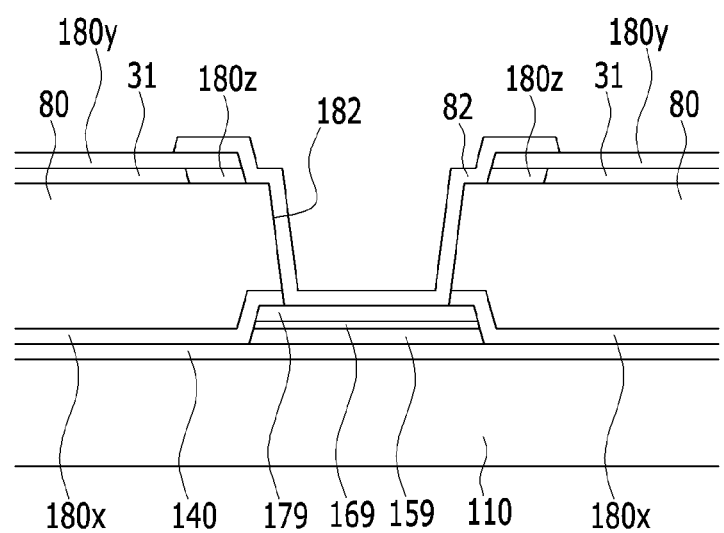
FIG. 37 is a cross-sectional view illustrating the thin film transistor array panel taken along line XXXVII-XXXVII of FIG. 34.

FIG. 34 is a plan view of still another exemplary embodiment of a TFT array panel according to the invention, FIG. 35 is a cross-sectional view illustrating the TFT array panel taken along line XXXV-XXXV' of FIG. 34, FIG. 36 is a cross-sectional view illustrating the TFT array panel taken along line XXXVI-XXXVI of FIG. 34, and FIG. 37 is a cross-sectional view illustrating the TFT array panel taken along line XXXVII-XXXVII of FIG. 34.

Referring to FIGS. 34 to 37, one or more gate line 121 is disposed on an insulation substrate 110. The gate line 121 includes a gate electrode 124 and a gate pad portion 129 extending from a main portion thereof.

A gate insulating layer 140 is disposed on a gate conductor 121, 124 and 129. A semiconductor 154 is disposed on the gate insulating layer 140. Ohmic contacts 163 and 165 are disposed on the semiconductor 154.

The semiconductor 154 may include an oxide semiconductor, and where the semiconductor 154 is an oxide semiconductor, the ohmic contacts 163 and 165 may be omitted.

One or more data line 171 and one or more drain electrode 175 is disposed on the ohmic contacts 163 and 165. The data line 171 includes a source electrode 173 protruded from a main portion thereof and extending toward the gate electrode 124, and a data pad portion 179.

A first semiconductor 159 and a first ohmic contact 169 are disposed under the data pad portion 179. In an alternative exemplary embodiment, the first semiconductor 159 and the first ohmic contact 169 may be omitted.

A first passivation layer 180x is disposed on a data conductor 171, 173, 175, and 179 and the exposed semiconductor 154, and the first passivation layer 180x may include an organic insulating material or an inorganic insulating material.

An organic film 80 is disposed on the first passivation layer 180x. The organic film 80 may be relatively thicker than the first passivation layer 180x in a cross-sectional direction, and may have a flat surface.

A common electrode 131 and a blocking member 31 are disposed on the organic film 80. The common electrode 131 and the blocking member 31 may include a transparent conductive material, such as ITO or IZO.

A first opening 138 is defined in the common electrode 131 at a position overlapping a portion of the drain electrode 175.

The common electrode 131 is disposed in a display region of the liquid crystal display in which a plurality of pixels is disposed to display an image, and the blocking member 31 is disposed in a peripheral region of the liquid crystal display in which the gate pad portion 129 and the data pad portion 179 are disposed.

A second passivation layer 180y is disposed on the common electrode 131 and the blocking member 31. A plane shape of the second passivation layer 180y is substantially the same as a plane shape of the common electrode 131 and the blocking member 31. That is, the second passivation layer 180y overlaps edges of the common electrode 131 and the blocking member 31. In an exemplary embodiment of manufacturing the liquid crystal display, the second passivation layer 180y, the common electrode 131 and the blocking member 31 may be formed (e.g., provided) together by using one photo mask, such that the plane shape of the second passivation layer 180y is substantially the same as the plane shape of the common electrode 131 and the blocking member 31.

Figure 38:
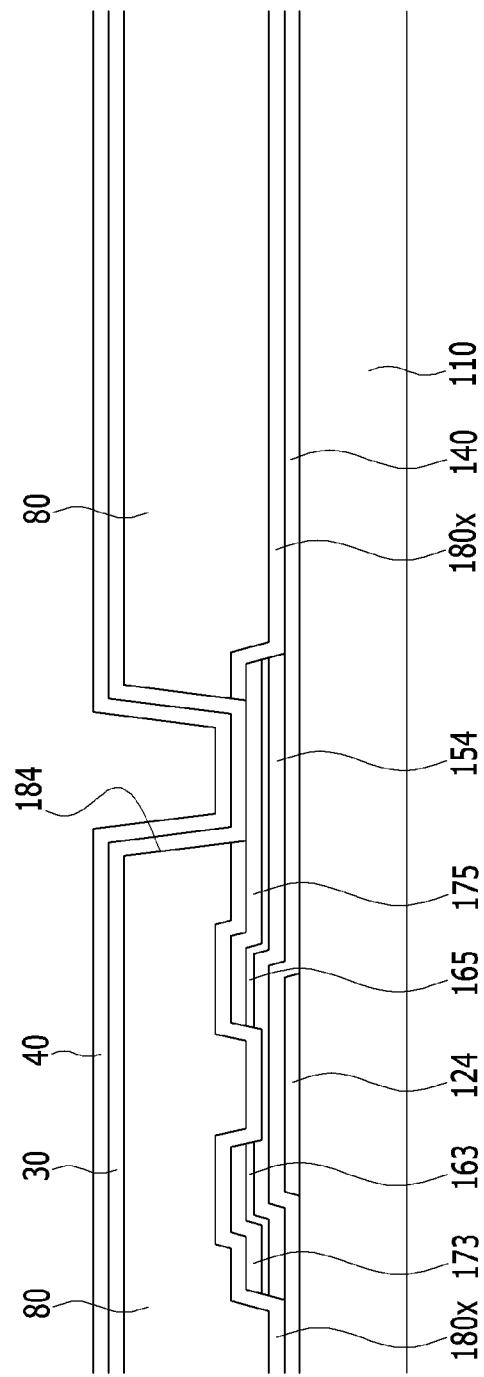
FIGS. 38, 41, 44, 47, 50, 53 and 56 are cross-sectional views sequentially illustrating an exemplary embodiment of a method of manufacturing the thin film transistor array panel according to the invention, taken along line XXXV-XXXV' of FIG. 34.
Figure 39:
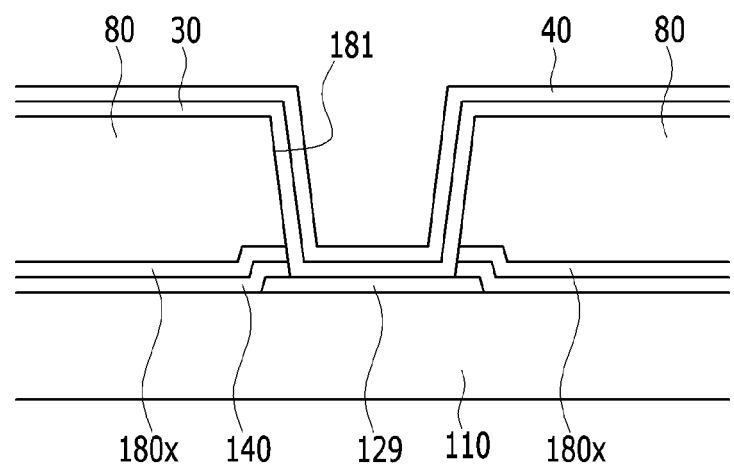
FIGS. 39, 42, 45, 48, 51, 54 and 57 are cross-sectional views sequentially illustrating the exemplary embodiment of the method of manufacturing the thin film transistor array panel according to the invention, taken along line XXXVI-XXXVI of FIG. 34.
Figure 40:
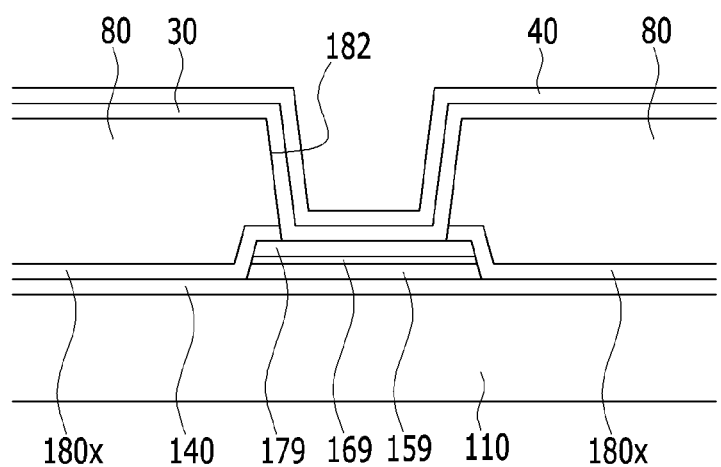
FIGS. 40, 43, 46, 49, 52, 55 and 58 are cross-sectional views sequentially illustrating the exemplary embodiment of the method of manufacturing the thin film transistor array panel according to the invention, taken along line XXXVII-XXXVII of FIG. 34.

However, referring to FIGS. 36 to 38, an edge of the second passivation layer 180y protrudes further than an edge of the common electrode 131 and the blocking member 31, at openings where the drain electrode 175, the gate pad portion 129 and the data pad portion 179 are exposed. That is, the common electrode 131 and the blocking member 31, and the second passivation layer 180y disposed on the common electrode 131 and the blocking member 31, have an inverse taper structure in which an upper layer protrudes further towards the openings than a lower layer.

A third passivation layer 180z is disposed at the edges of the common electrode 131 and the blocking member 31, such as adjacent and/or contacting the edges of the common electrode 131 and the blocking member 31. The third passivation layer 180z is disposed under the second passivation layer 180y, and is disposed to surround the openings where the edges of the common electrode 131 and the blocking member 31 are disposed.

An edge of the third passivation layer 180z is disposed to substantially meet or coincide with the edge of the second passivation layer 180y. The side surfaces at the edges of the second and third passivation layers 180y and 180z at the openings may be aligned or coplanar with each other. The common electrode 131 and the blocking layer 31 expose an edge of the second passivation layer 180y. The second and third passivation layers 180y and 180z expose an edge of the organic film 80.

As described above, the exemplary embodiment of the TFT array panel according to the invention includes a third passivation layer 180z disposed under the second passivation layer 180y and surrounding openings at the edges of the common electrode 131 and the blocking member 31, so that the common electrode 131, the blocking member 31 and the third passivation layer 180z are disposed on a same layer of the TFT array panel, and the second passivation layer 180y disposed on the common electrode 131, the blocking member 31 and the third passivation layer 180z removes or compensates for the inverse taper structure formed by the second passivation layer 180y disposed on the common electrode 131 and the blocking member 31.

A first contact hole 184 exposing a portion of the drain electrode 175 is defined in the organic film 80 and the first passivation layer 180x.

A second contact hole 181 exposing a portion of the gate pad portion 129 is defined in the organic film 80, the first passivation layer 180x and the gate insulating layer 140.

A third contact hole 182 exposing a data pad portion 179 is defined in the organic film 80 and the first passivation layer 180x.

A pixel electrode 191, a first contact assistant 81 and a second contact assistant 82 are disposed on the second passivation layer 180y and the third passivation layer 180z. The pixel electrode 191, the first contact assistant 81 and the second contact assistant 82 may include a transparent conductive material, such as ITO or IZO.

The pixel electrode 191 is electrically connected with the drain electrode 175 through the first contact hole 184 to receive a data voltage. The pixel electrode 191 includes a plurality of branch electrodes 193 generally extended in the vertical direction, parallel to each other and spaced apart from each other, and lower and upper horizontal portions 192 connecting upper and lower end portions of the branch electrodes 193. The branch electrodes 193 of the pixel electrode 191 may be parallel to the data lines 171. Where the data lines 171 are bent, the branch electrodes 193 may also be bent and extend along the data lines 171. The branch electrodes 193 may be defined by openings or cutouts defined in the pixel electrode 191.

The first contact assistant 81 is disposed on the gate pad portion 129 exposed through the second contact hole 181, and the second contact assistant 82 is disposed on the data pad portion 179 exposed through the third contact hole 182.

The pixel electrode 191 receiving the data voltage generates an electric field in a liquid crystal layer disposed on the TFT array panel, together with the common electrode 131 receiving a common voltage.

According to the exemplary embodiment of TFT array panel according to the invention, the second passivation layer 180y, the common electrode 131 and the blocking member 31 may be formed together by using one photo mask. Accordingly, it is possible to reduce or effectively prevent an increase of manufacturing cost of the liquid crystal display. Further, it is possible to reduce or effectively prevent static electricity and the like introduced from outside the liquid crystal display from being introduced in a signal line by forming the blocking member 31 around the gate pad portion 129 and the data pad portion 179. The signal line may include the gate line 121 and/or the data line 171.

According to the exemplary embodiment of TFT array panel according to the invention, any one of the common electrode 131 and the pixel electrode 191 may have the branch electrode, and the other one may have a planar shape, but the invention is not limited thereto. As the planar shape, an electrode may be a single, unitary, indivisible member and/or disposed on an entire of a substrate, without an opening defined therein. The branch electrodes may be defined by openings or cutouts defined in the respective electrode.

Next, an exemplary embodiment of a method of manufacturing the TFT array panel according to the invention will be described with reference to FIGS. 38 to 55 together with FIGS. 34 to 37.

FIGS. 38, 41, 44, 47, 50 and 53 are cross-sectional views illustrating an exemplary embodiment of a method of manufacturing the TFT array panel according to the invention, taken along line XXXV-XXXV' of FIG. 34. FIGS. 39, 42, 45, 48, 51 and 54 are cross-sectional views illustrating the exemplary embodiment of the method of manufacturing the TFT array panel according to the invention, taken along line XXXVI-XXXVI of FIG. 34. FIGS. 40, 43, 46, 49, 52 and 55 are cross-sectional views illustrating the exemplary embodiment of the method of manufacturing the TFT array panel according to the invention, taken along line XXXVII-XXXVII of FIG. 34.

Referring to FIGS. 38 to 40 and FIG. 4-, the gate conductor 121, 124 and 129 including the gate lines 121, the gate electrodes 124 and the gate pad portions 129 is formed (e.g., provided) on the insulation substrate 110, and the gate insulating layer 140 is deposited on the gate conductor 121, 124 and 129. The semiconductor 154, the first semiconductor 159, the ohmic contacts 163 and 165, the first ohmic contact 169 and the data conductor 171, 173, 175, and 179 including the data lines 171, the source electrodes 173, the drain electrodes 175, and the data pad portions 179 are formed on the gate insulating layer 140.

The first passivation layer 180x is deposited on the data conductor 171, 173, 175, and 179, and the exposed semiconductor 154.

The organic film 80 is formed on the first passivation layer 180x, and the first passivation layer 180x and the gate insulating layer 140 are etched to define the first contact hole 184 exposing a portion of the drain electrode 175, the second contact hole 181 exposing a portion of the gate pad portion 129, and the third contact hole 182 a portion the data pad portion 179.

A second conductive layer 30 is deposited on the organic film 80, and a first insulating layer 40 is deposited on the second conductive layer 30.

Figure 41:
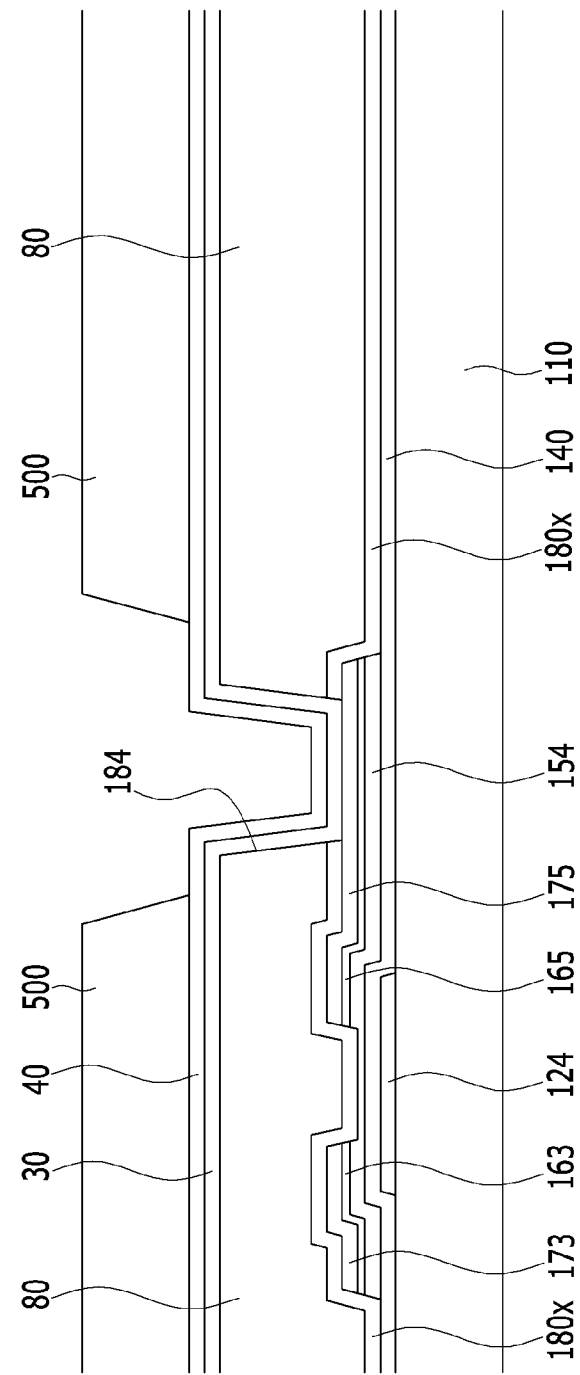
Figure 42:
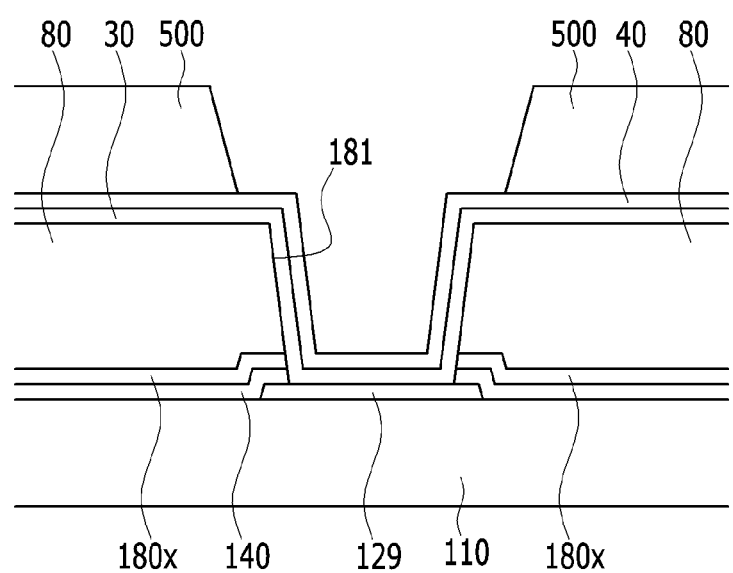
Figure 43:
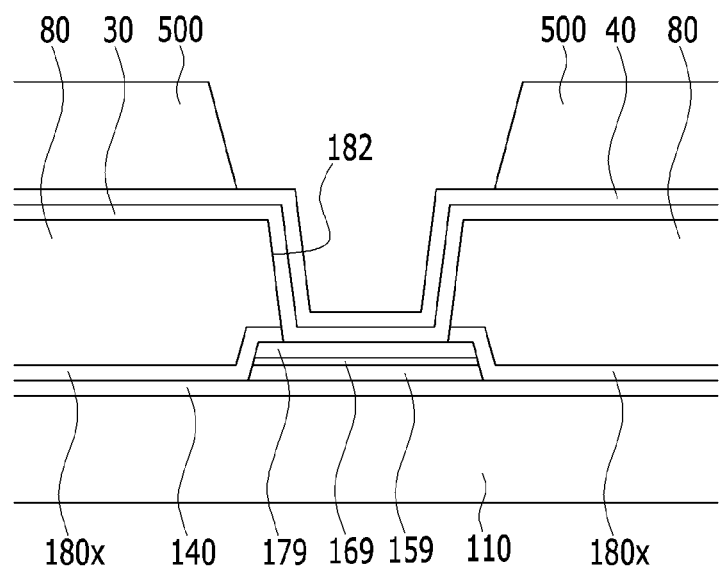

As illustrated in FIGS. 41 to 43, a photosensitive film is deposited on the first insulating layer 40 and then is exposed and developed to form a second photosensitive film pattern 500.

Figure 44:
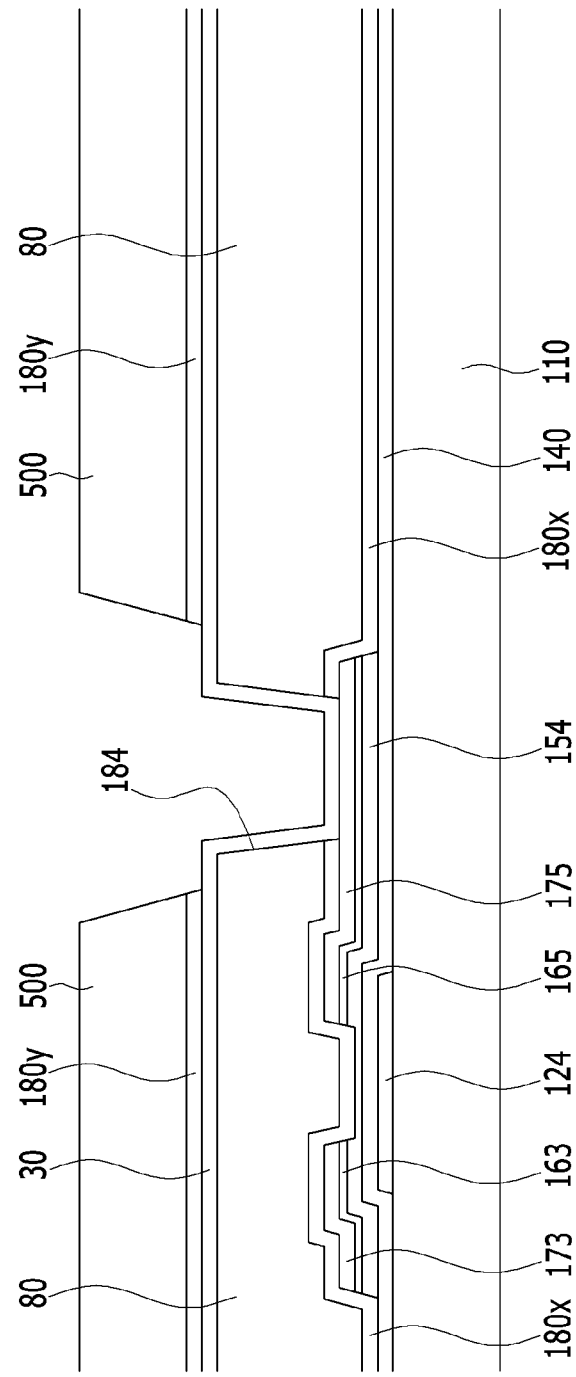
Figure 45:
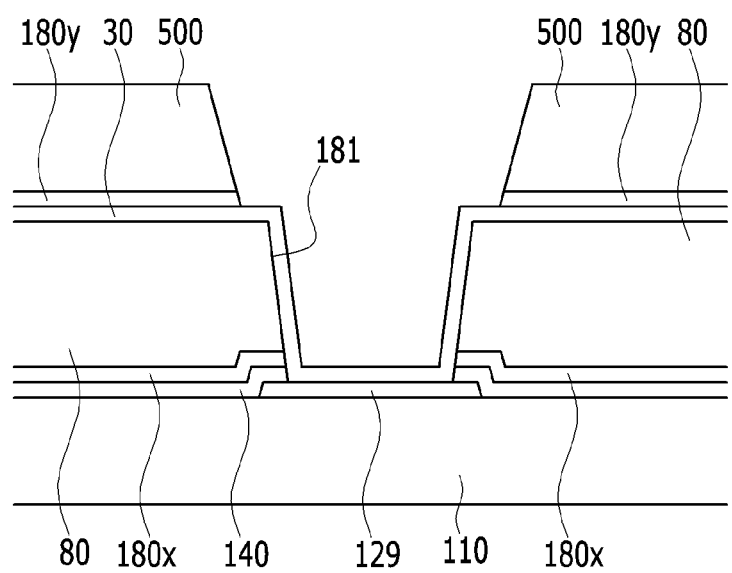
Figure 46:
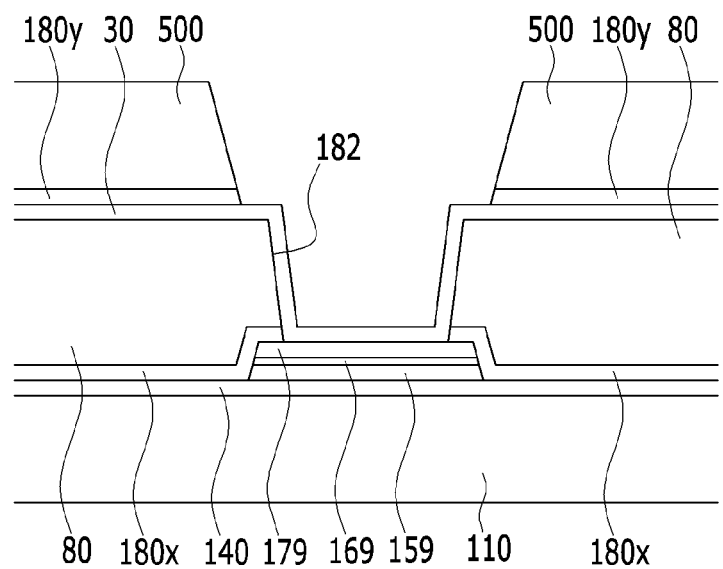

As illustrated in FIGS. 44 to 46, the first insulating layer 40 is etched by using the second photosensitive film pattern 500 as an etching mask to form the second passivation layer 180y.

Figure 47:
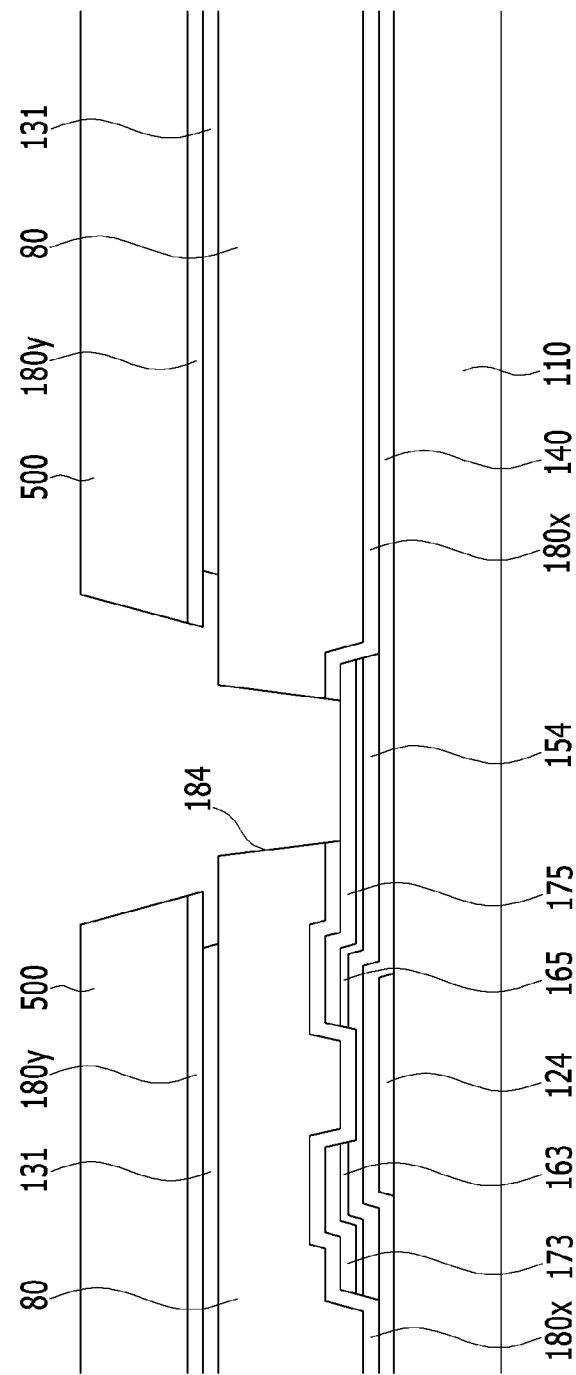
Figure 48:
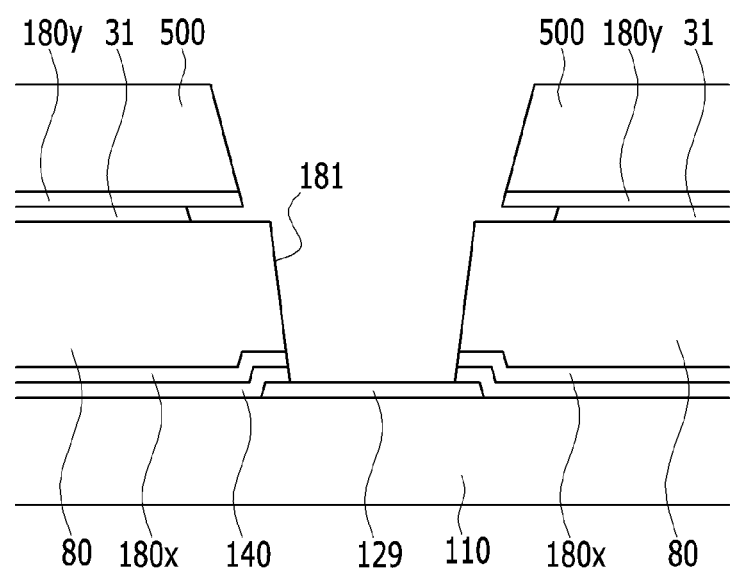
Figure 49:
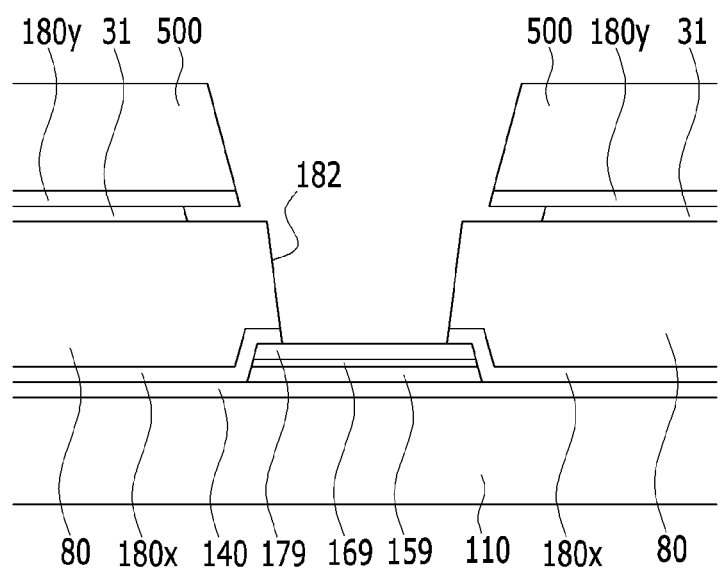

As illustrated in FIGS. 47 to 49, the second conducive layer 30 is etched by using the second photosensitive film pattern 500 as an etching mask to form the common electrode 131 and the blocking member 31.

An etchant capable of etching only the second conductive layer 30 and incapable of etching the drain electrode 175, the gate pad portion 129 and the data pad portion 179 is used.

Further, the edges of the common electrode 131 and the blocking member 31 are disposed at an inner side of the edge of the second passivation layer 180y by sufficiently etching the common electrode 131 and the blocking member 31. Accordingly, the edge of the second passivation layer 180y protrudes further toward the first, second and third contact holes 184, 181 and 182 than the edges of the common electrode 131 and the blocking member 31.

Figure 50:
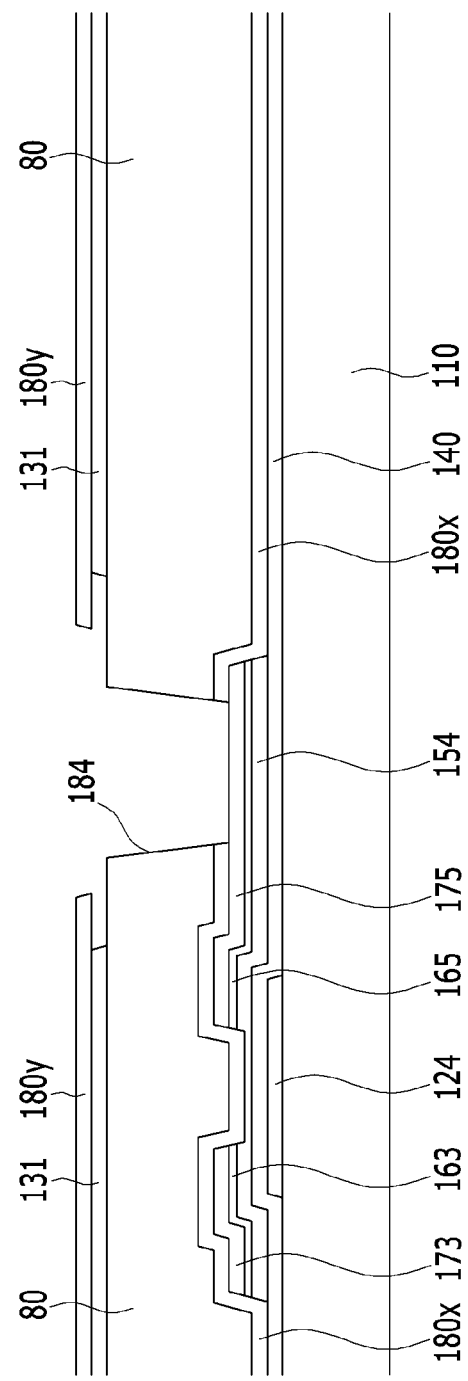
Figure 51:
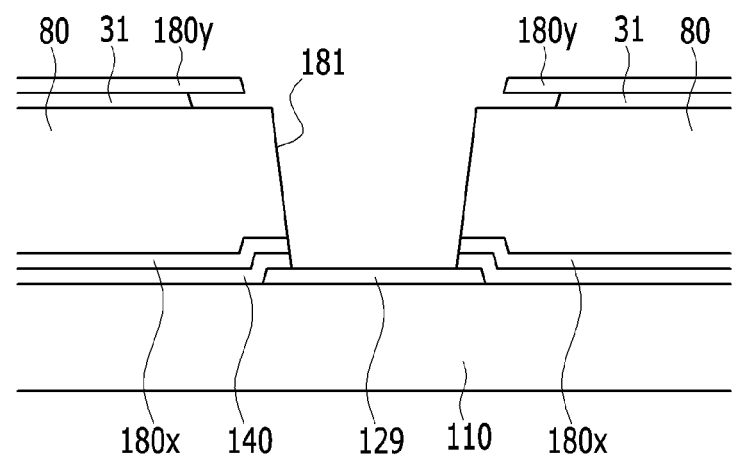
Figure 52:
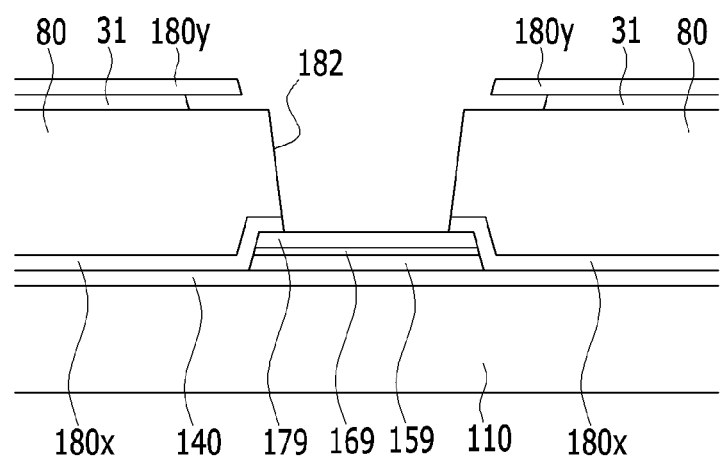

As illustrated in FIGS. 50 to 52, the second photosensitive film pattern 500 is removed by ashing and the like.

Figure 53:
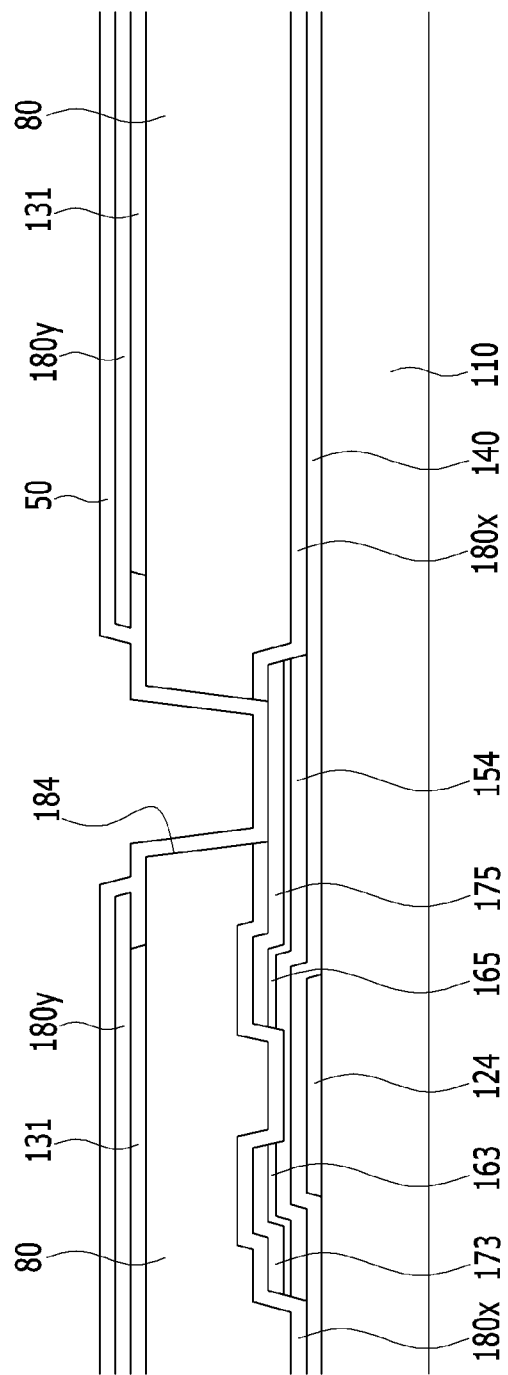
Figure 54:
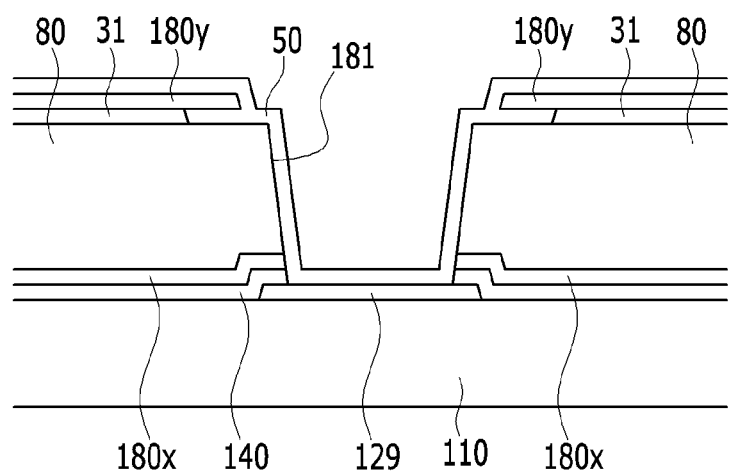
Figure 55:
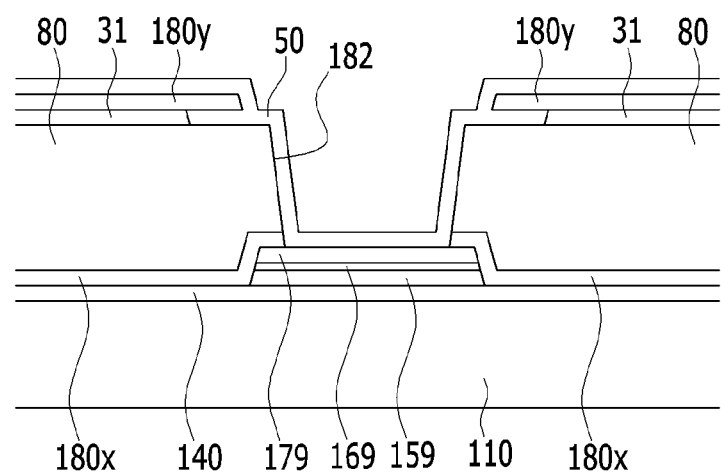

As illustrated in FIGS. 53 to 55, a second insulating layer 50 having a sufficient thickness is deposited on the second passivation layer 180y, and between the organic film 80 and the overhanging second passivation layer 180y at the first, second and third contact holes 184, 181 and 182.

Figure 56:
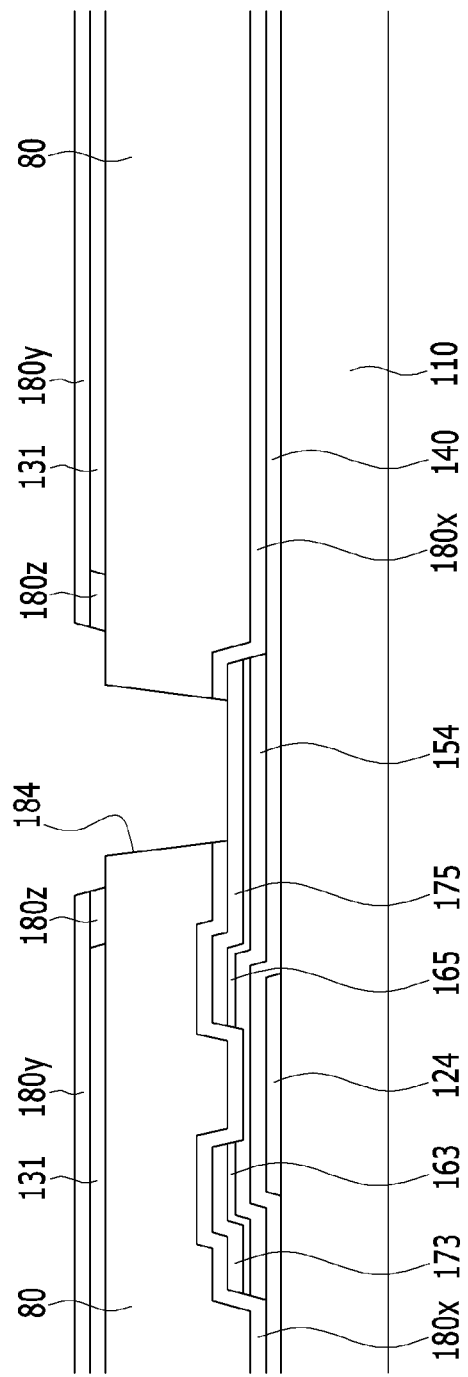
Figure 57:
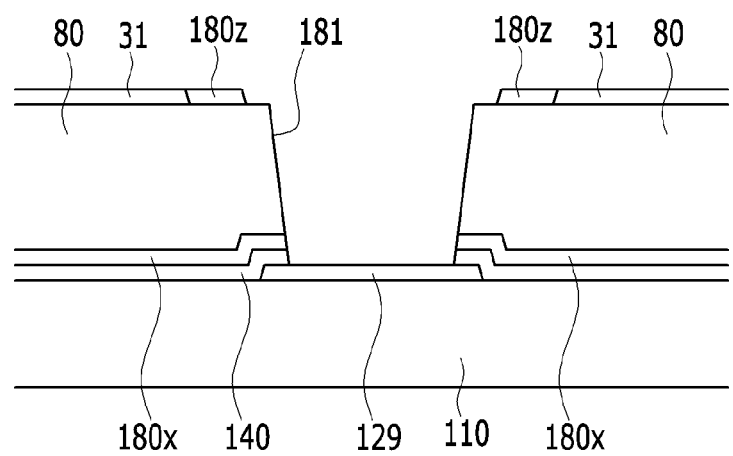
Figure 58:
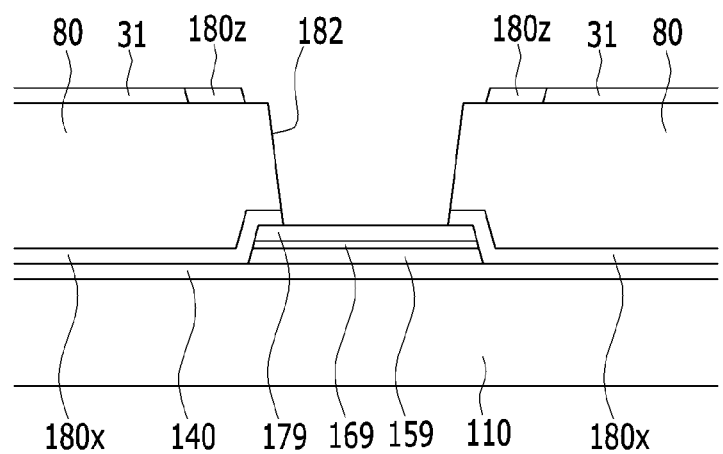

Referring to FIGS. 56 to 58, the third passivation layer 180z surrounding the edges of the common electrode 131 and the blocking member 31 is formed by removing the second passivation layer 180y and the second insulating layer 50 disposed in the contact holes 184, 181 and 182 by dry-etching the second insulating layer 50.

According to the exemplary embodiment of the method of manufacturing the TFT array panel according to the invention, the common electrode 131 and the blocking member 31, and the second passivation layer 180y disposed on the common electrode 131 and the blocking member 31, are formed together by using one photo mask. The third passivation layer 180z disposed under the second passivation layer 180y and surrounding the edges of the common electrode 131 and the blocking member 31 is formed, so that the common electrode 131, the blocking member 31 the third passivation layer 180z disposed in a the same layer as the TFT array panel and the second passivation layer 180y disposed on the common electrode 131, the blocking member 31 and the third passivation layer 180z do not have an inverse taper structure.

Referring again to FIGS. 35 to 37, the pixel electrode 191, the first contact assistant 81 and the second contact assistant 82 are formed on the second passivation layer 180y and the third passivation layer 180z.

The pixel electrode 191 is electrically connected with the drain electrode 175 through the first contact hole 184. The first contact assistant 81 is disposed on the gate pad portion 129 exposed through the second contact hole 181, and the second contact assistant 82 is disposed on the data pad portion 179 exposed through the third contact hole 182.

As described above, the third passivation layer 180 surrounding the edges of the common electrode 131 and the blocking member 31 is formed, so that the common electrode 131, the blocking member 31 and the third passivation layer 180z disposed in the same layer of the TFT array panel, and the second passivation layer 180y disposed on the common electrode 131, the blocking member 31 and the third passivation layer 180z do not have the inverse taper structure. Accordingly, it is possible to reduce or effectively prevent a short circuit of the pixel electrode 191 disposed on the second passivation layer 180y and the third passivation layer 180z, the first contact assistant 81, and the second contact assistant 82 due to the inverse taper structure.

According to the exemplary embodiment of the method of manufacturing the TFT array panel according to the invention, the common electrode 131 and the blocking member 31, and the second passivation layer 180y disposed on the common electrode 131 and the blocking member 31, are formed together by using one photo mask. Accordingly, it is possible to reduce or effectively prevent an increase of manufacturing cost of the liquid crystal display.

The characteristics of one or more of the previously described exemplary embodiment of a TFT array panel are applicable to a liquid crystal display in which the common electrode and the pixel electrode as the two field generating electrodes are disposed on the TFT display panel including only one single substrate.

The above-described exemplary embodiment of a TFT array panels according to the inventions have been described based on a structure where any one among the two overlapping field generating electrodes has a planar shape, and the other one has a branch portion, but the invention is applicable to other structures of TFT array panels having two field generating electrodes in one display panel. As the planar shape, an electrode may be a single, unitary, indivisible member and/or disposed on an entire of a substrate, without an opening defined therein. The branch electrodes may be defined by openings or cutouts defined in the respective electrode.

In one or more exemplary embodiment of a TFT array panel and a method of manufacturing the same, a passivation layer disposed between a first field generating electrode and a second field generating electrode overlapping each other is thin and includes a transparent photosensitive organic material. The passivation layer is used as a photosensitive film when providing the first field generating electrode, so that the passivation layer and the first field generating electrode disposed under the passivation layer may be formed together by using one photo mask. Accordingly, it is possible to prevent an increase in manufacturing cost of the thin film transistor array panel.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel, comprising:
an insulation substrate;
a gate line and a data line on the insulation substrate;
a first passivation layer on the gate line and the data line;
an organic layer on the first passivation layer;
a first electrode on the organic layer;
a second electrode connected to a thin film transistor via a contact hole defined in the organic layer; and
a second passivation layer between the first electrode and the second electrode which is connected to the thin film transistor via the contact hole defined in the organic layer,
wherein
an edge of the organic layer is exposed by the first electrode at the contact hole via which the second electrode is connected to the thin film transistor,
the second passivation layer is extended to define a first portion thereof at the exposed edge of the organic layer, the first portion of the second passivation layer disposed between the second electrode and the organic layer, and
the first portion of the second passivation layer extends to be disposed inside the contact hole via which the second electrode is connected to the thin film transistor.

2. The thin film transistor array panel of claim 1, wherein:
the gate line comprises a gate pad portion at a distal end thereof, and
the data line comprises a data pad portion at a distal end thereof,
further comprising a blocking member on the organic layer, wherein the blocking member on the organic layer is at a peripheral region of the gate pad portion and at a peripheral region of the data pad portion.

3. The thin film transistor array panel of claim 2, wherein:
the blocking member is in a same layer as the first electrode.

4. The thin film transistor array panel of claim 3, wherein:
the blocking member at the peripheral region of the gate pad portion and the data pad portion exposes an edge of the organic layer at the peripheral region of the gate pad portion and the data pad portion.

5. The thin film transistor array panel of claim 1, wherein:
one of the first electrode and the second electrode has a planar shape, and the other of the first electrode and the second electrode comprises a branch electrode defined by an opening portion defined in the other electrode.

6. The thin film transistor array panel of claim 1, further comprising:
a common voltage line in a same layer as the gate line or the data line,
wherein
an opening defined in the organic layer and the first electrode exposes a portion of the common voltage line, and
a contact hole defined in the second passivation layer exposes the first electrode, and
further comprising a connecting member covering the common voltage line exposed through the opening and the first electrode exposed through the contact hole.

7. The thin film transistor array panel of claim 6, wherein:
the connecting member is spaced apart from the second electrode, and is in a same layer as the second electrode.

8. A thin film transistor array panel, comprising:
an insulation substrate;
a gate line and a data line on the insulation substrate;
a first passivation layer on the gate line and the data line;
an organic layer on the first passivation layer and in which a contact hole is defined, wherein a sidewall of the organic layer defines the contact hole in the organic layer;
a first electrode on the organic layer, the first electrode exposing an upper surface of the organic layer extended from the sidewall thereof;
a second passivation layer on the first electrode;
a second electrode on the second passivation layer, the second electrode connected to a thin film transistor via the contact hole defined in the organic layer; and
a third passivation layer between the second passivation layer and the organic layer, the third passivation layer disposed non-overlapping with the first electrode and covering a side surface of the first electrode at an edge thereof,
wherein
the second passivation layer overlaps the side surface and the edge of the first electrode in a plan view, and
edges of the second and third passivation layers at the contact hole via which the second electrode is connected to the thin film transistor each exposes the exposed upper surface of the organic layer extended from the sidewall thereof.

9. The thin film transistor array panel of claim 8, wherein:
the first electrode exposes an edge of the second passivation layer.

10. The thin film transistor array panel of claim 9, wherein:
the edges of the second and third passivation layers at the contact hole via which the second electrode is connected to the thin film transistor substantially coincide with each other, and
the coinciding edges of the second and third passivation layers at the contact hole expose the upper surface of the organic layer extended from the sidewall thereof.

11. The thin film transistor array panel of claim 10, wherein:
the gate line comprises a gate pad portion at a distal end thereof, and
the data line comprises a data pad portion at a distal end thereof,
further comprising a blocking member on the organic layer, wherein the blocking member on the organic layer is at a peripheral region of the gate pad portion and at a peripheral portion of the data pad portion.

12. The thin film transistor array panel of claim 11, wherein:
the blocking member is in a same layer as the first electrode.

13. The thin film transistor array panel of claim 12, wherein:
the second passivation layer at the peripheral region of the gate pad portion and the data pad portion overlaps an edge of the blocking member at the peripheral region of the gate pad portion and the data pad portion.

14. The thin film transistor array panel of claim 13, wherein:
the blocking member exposes an edge of the second passivation layer at the peripheral region of the gate pad portion and the data pad portion.

15. The thin film transistor array panel of claim 14, wherein:
- the third passivation layer covers a side surface at the edge of the blocking member at the peripheral region of the gate pad portion and the data pad portion, and
- an edge of the third passivation layer at the peripheral region of the gate pad portion and the data pad portion substantially coincides with the edge of the second passivation layer at the peripheral region of the gate pad portion and the data pad portion.

16. The thin film transistor array panel of claim 8, wherein:
- one of the first electrode and the second electrode has a planar shape, and the other of the first electrode and the second electrode comprises a branch electrode defined by an opening portion defined in the other electrode.

* * * * *